(12) United States Patent
Youn et al.

(10) Patent No.: US 11,605,699 B2
(45) Date of Patent: Mar. 14, 2023

(54) DISPLAY DEVICE

(71) Applicant: Samsung Display Co., LTD., Yongin-si (KR)

(72) Inventors: Il Goo Youn, Asan-si (KR); Ji Eun Lee, Seoul (KR); Jun Young Jo, Hwaseong-si (KR); Min Hee Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 225 days.

(21) Appl. No.: 17/161,876

(22) Filed: Jan. 29, 2021

(65) Prior Publication Data
US 2021/0376040 A1     Dec. 2, 2021

(30) Foreign Application Priority Data

May 27, 2020 (KR) .......................... 10-2020-0063651

(51) Int. Cl.
*H01L 51/00* (2006.01)
*H01L 27/12* (2006.01)
(Continued)

(52) U.S. Cl.
CPC ...... *H01L 27/3276* (2013.01); *H01L 27/3258* (2013.01); *H01L 27/3262* (2013.01); *H01L 51/0097* (2013.01); *G09G 3/3225* (2013.01); *G09G 3/3266* (2013.01); *G09G 2300/0809* (2013.01); *H01L 27/124* (2013.01); *H01L 27/1225* (2013.01); *H01L 27/1251* (2013.01);
(Continued)

(58) Field of Classification Search
CPC ............ H01L 27/3276; H01L 27/3258; H01L 27/3262; H01L 51/0097; H01L 27/1225; H01L 27/124; H01L 27/1251; H01L 29/78651; H01L 29/7869; H01L 2251/5338; H01L 27/1218; H01L 27/1244; H01L 27/3248; H01L 27/3279; H01L 27/1248; G09G 3/3225; G09G 3/3266; G09G 2300/0809; G09G 3/3233; G09G 2300/0426; Y02E 10/549
See application file for complete search history.

(56) References Cited

U.S. PATENT DOCUMENTS

2021/0005677 A1* 1/2021 Lee .................. G06F 3/0412
2021/0159298 A1  5/2021 Youn et al.

FOREIGN PATENT DOCUMENTS

KR   1020180031898 A   3/2018
KR   1020190032711 A   3/2019
(Continued)

*Primary Examiner* — Kyoung Lee
(74) *Attorney, Agent, or Firm* — Cantor Colburn LLP

(57) ABSTRACT

A display device includes: a substrate; a display area including pixels arranged on the substrate; a first area disposed at one side of the display area; a second area including pads arranged on the substrate; a bending area disposed between the first area and the second area; and a fan-out line disposed in the first area, the bending area, and the second area. The fan-out line includes: a plurality of sub-routing lines arranged in the first area and electrically connected to each other; and a plurality of sub-pad lines arranged in the second area and electrically connected to each other. The number of the plurality of sub-routing lines is greater than the number of the plurality of sub-pad lines.

20 Claims, 34 Drawing Sheets

(51) Int. Cl.
  *H01L 27/32* (2006.01)
  *H01L 29/786* (2006.01)
  *G09G 3/3266* (2016.01)
  *G09G 3/3225* (2016.01)
(52) U.S. Cl.
  CPC .... *H01L 29/7869* (2013.01); *H01L 29/78651* (2013.01); *H01L 2251/5338* (2013.01)

(56) References Cited

FOREIGN PATENT DOCUMENTS

| KR | 1020200023569 A | 3/2020 |
|----|-----------------|--------|
| KR | 1020200032302 A | 3/2020 |
| KR | 1020210062772   | 6/2021 |

* cited by examiner

DISPLAY DEVICE

This application claims priority to Korean Patent Application No. 10-2020-0063651 filed on May 27, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

With the development of information society, requirements for a display device for displaying images have increased in various forms. For example, the display device is applied to various electronic appliances such as smart phones, digital cameras, notebook computers, navigators, and smart televisions. The display device may be a flat panel display device such as a liquid crystal display device, a field emission display device, or a light emitting display device.

SUMMARY

In the display device, in order to increase a display area for displaying an image, a bezel area or a non-display area, excluding the display area, has been minimized. Further, the corner portion of the display device has been formed in a round shape having a predetermined curvature. In this case, due to the lines arranged in the non-display area of the corner portion of the display device, there is a limitation in reducing the non-display area of the corner portion.

Embodiments of the invention provide a display device that can reduce a width of a non-display area without reducing the number of lines arranged in the non-display area.

An embodiment of the invention provides a display device including: a substrate; a display area including pixels arranged on the substrate; a first area disposed at one side of the display area; a second area including pads arranged on the substrate; a bending area disposed between the first area and the second area; and a fan-out line disposed in the first area, the bending area, and the second area. The fan-out line includes: a plurality of sub-routing lines arranged in the first area and electrically connected to each other; and a plurality of sub-pad lines arranged in the second area and electrically connected to each other. The number of the plurality of sub-routing lines is greater than the number of the plurality of sub-pad lines.

Another embodiment of the invention provides a display device including: a substrate including a first side extending in a first direction, a second side extending in a second direction, and a first corner portion where the first side and the second side meet each other; a display area including pixels, scan lines, and data lines, which are arranged on the substrate; a non-display area disposed adjacent to the display area; a scan driver disposed adjacent to the first side in the non-display area and which outputs scan signals to the scan lines; and a fan-out line disposed adjacent to the first corner portion in the non-display area and connected to the scan driver. The fan-out line includes a plurality of sub-routing lines. The plurality of sub-routing lines overlaps each other in a thickness direction of the substrate. Widths of the plurality of sub-routing lines are different from each other.

BRIEF DESCRIPTION OF THE DRAWINGS

These and/or other features of the invention will become apparent and more readily appreciated from the following description of the exemplary embodiments, taken in conjunction with the accompanying drawings, in which.

DETAILED DESCRIPTION

Figure 1:
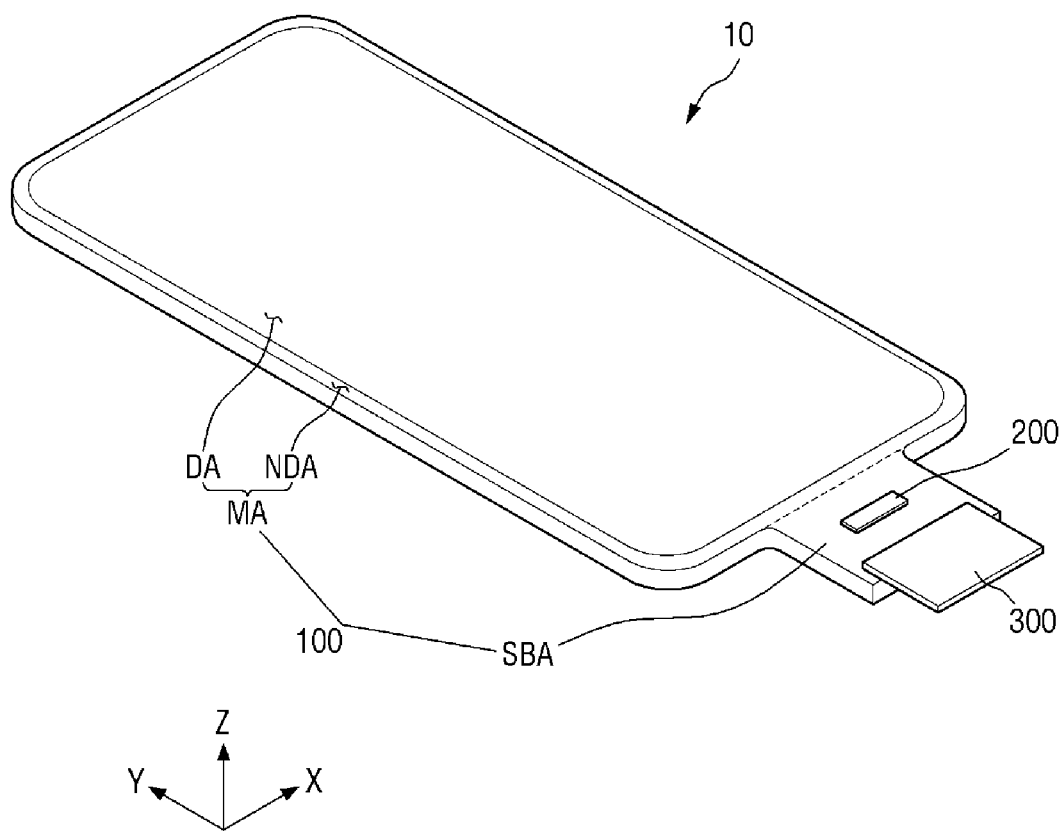
FIG. 1 is a perspective view of a display device according to an embodiment.

Exemplary embodiments of the invention will now be described more fully hereinafter with reference to the accompanying drawings, in which preferred embodiments of the invention are shown. The invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or non-linear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a perspective view of a display device according to an embodiment.

Referring to FIG. 1, a display device 10, which is a device for displaying a moving image or a still image, may be used as a display screen of various products such as televisions, notebooks, monitors, billboards, internet of things ("IOTs") as well as portable electronic appliances such as mobile phones, smart phones, tablet personal computers (tablet PCs), smart watches, watch phones, mobile communication terminals, electronic notebooks, electronic books, portable multimedia players ("PMPs"), navigators, and ultra mobile PCs ("UMPCs").

The display device 10 may be a light emitting display device such as an organic light emitting display device using an organic light emitting diode, a quantum dot light emitting display device including a quantum dot light emitting layer, an inorganic light emitting display device including an inorganic semiconductor, or a micro light emitting display device using a micro light emitting diode ("LED"). Hereinafter, the display device 10 will be mainly described as an organic light emitting display device, but the present invention is not limited thereto.

The display device 10 includes a display panel 100, a display driving circuit 200, and a circuit board 300.

The display panel 100 may have a substantially rectangular planar shape having short sides extended in the first direction (X-axis direction) and long sides extended in the second direction (Y-axis direction). The corner where the short side extended in the first direction (X-axis direction)

meets the long side extended in the second direction (Y-axis direction) may have a round shape of a predetermined curvature or have a right angle shape. The planar shape of the display panel 100 is not limited to the substantially rectangular shape, but may be in another polygonal shape, circular shape, or elliptical shape in another embodiment. The display panel 100 may be flat, but the present invention is not limited thereto. For example, the display panel 100 may include a curved portion at the left and right ends thereof and having a constant curvature or a variable curvature in a third direction (Z-axis direction). In addition, the display panel 100 may be flexible to be bent, warped, folded, or rolled.

The display panel 100 may include a main area MA and a sub-area SBA.

The main area MA may include a display area DA for displaying an image, and a non-display area NDA which is a peripheral area of the display area DA. The display area DA includes display pixels which is configured to display an image. The non-display area NDA may not include display pixels and display an image. The sub-area SBA may protrude from one short side of the main region MA in the second direction (Y-axis direction).

Although it is illustrated in FIG. 1 that the sub-area SBA is unfolded, the sub-area SBA may be bent, and in this case, the sub-area SBA may be disposed on the lower surface of the main region MA. When the sub-area SBA is bent, the sub-area SBA may overlap the main area MA in the thickness direction (Z-axis direction) of the substrate SUB. The display driving circuit 200 may be disposed in the sub-area SBA.

The display driving circuit 200 may generate signals and voltages for driving the display panel 100. The display driving circuit 200 may be an integrated circuit ("IC"), and may be attached onto the display panel 100 by a chip on glass ("COG") method, a chip on plastic ("COP") method, or an ultrasonic bonding method. However, the present invention is not limited thereto. For example, the display driving circuit 200 may be attached onto the circuit board 300 by a chip on film ("COF") method.

The circuit board 300 may be attached to one end of the sub-area SBA of the display panel 100. Thus, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip on film.

Figure 2:
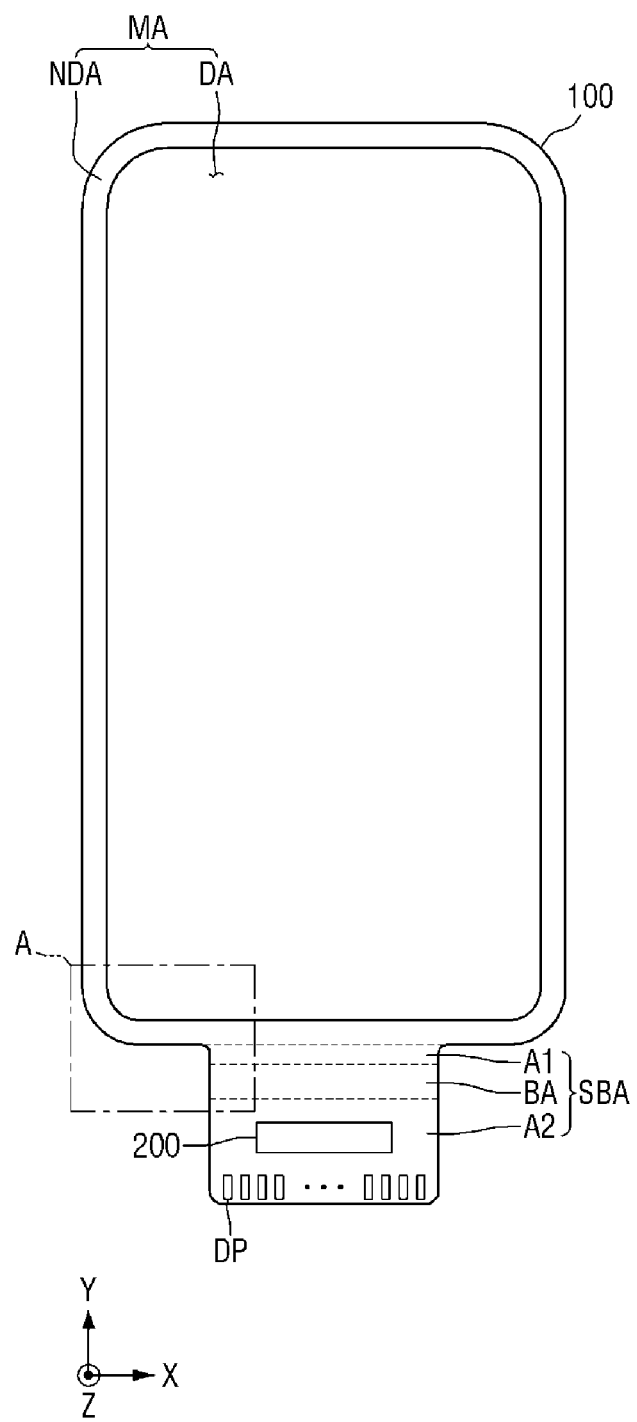
FIGS. 2 and 3 are plan views of a display device according to an embodiment.
Figure 3:
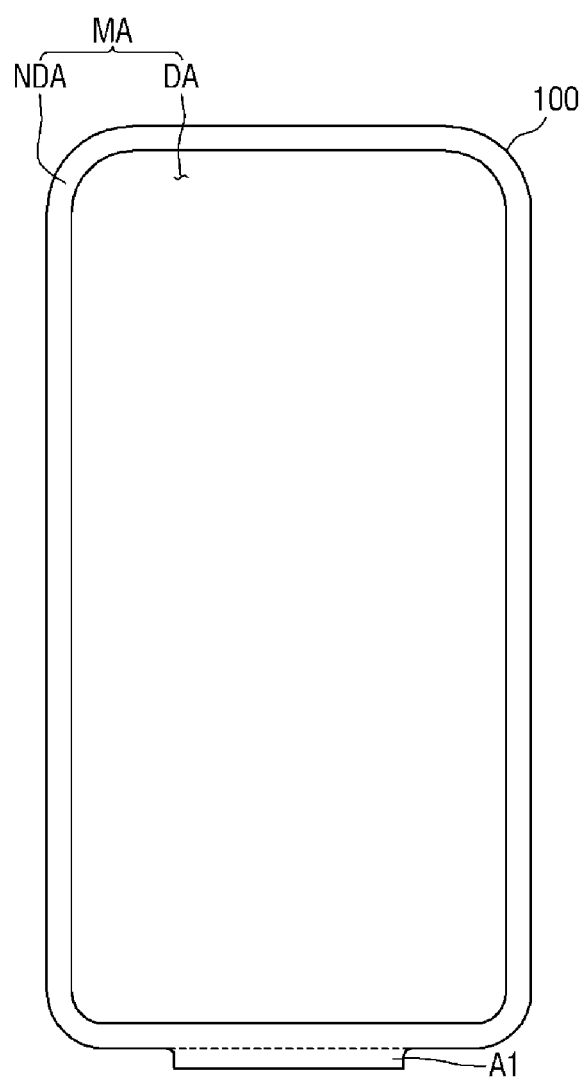
Figure 4:
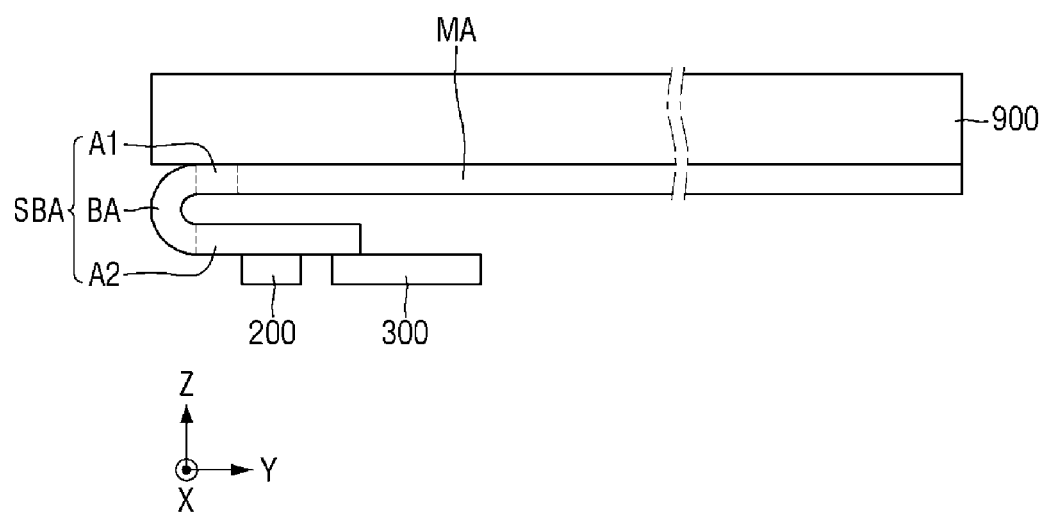
FIG. 4 is a side view of a display device according to an embodiment.

FIGS. 2 and 3 are plan views of a display device according to an embodiment, and FIG. 4 is a side view of a display device according to an embodiment.

It is illustrated in FIG. 2 that the sub-area SBA is unfolded without being bent. It is illustrated in FIGS. 3 and 4 that the sub-area SBA is bent.

Referring to FIGS. 2 to 4, the display panel 100 may include a main area MA and a sub-area SBA.

The main area MA may include a display area DA for displaying an image, and a non-display area NDA which is a peripheral area of the display area DA. The display area DA may occupy most of the main area MA. The display area DA may be disposed at the center of the main area MA.

The non-display area NDA may be disposed adjacent to the display area DA. The non-display area NDA may be an area outside the display area DA. The non-display area NDA may be an edge area of the display panel 100.

The sub-area SBA may protrude from one side of the main area MA in the second direction (Y-axis direction). The length of the sub-area SBA in the second direction (Y-axis direction) may be smaller than the length of the main area MA in the second direction (Y-axis direction). The length of the sub-area SBA in the first direction (X-axis direction) may be smaller than the length of the main area MA in the first direction (X-axis direction), or may be substantially the same as the length of the main area MA in the first direction (X-axis direction). The sub-area SBA may be bent, and may be disposed on the rear surface of the main area MA in a folded state. In this case, the sub-area SBA may overlap the main area MA in the third direction (Z-axis direction).

The sub-area SBA may include a first area A1, a second area A2, and a bending area BA.

The first area A1 is an area protruding from the one side of the main area MA in the second direction (Y-axis direction). One side of the first area A1 may be in contact with the non-display area NDA of the main area MA, and the other side of the first area A1 may be in contact with the bending area BA.

The second area A2 is an area where the display pads DP and the display driving circuit 200 are disposed. The display driving circuit 200 may be attached to the driving pads of the second area A2 using a low-resistance and high-reliability material such as an anisotropic conductive film or a self assembly anisotropic conductive paste ("SAP"). The circuit board 300 may be attached to the display pads DP of the second area A2 using an anisotropic conductive film or a low-resistance and high-reliability material such as SAP. One side of the second area A2 may be in contact with the bending area BA.

The bending area BA is a bendable area. When the bending area BA is bent, the second area A2 may be disposed under the first area A1 and under the main area MA. The bending area BA may be disposed between the first area A1 and the second area A2. One side of the bending area BA may be in contact with the first area A1, and the other side of the bending area BA may be in contact with the second area A2.

The display device 10 further includes a cover window 900. The cover window 900 is disposed on the display panel 100. A thickness of the cover window 900 is greater than a thickness of the display panel 100.

Figure 5:
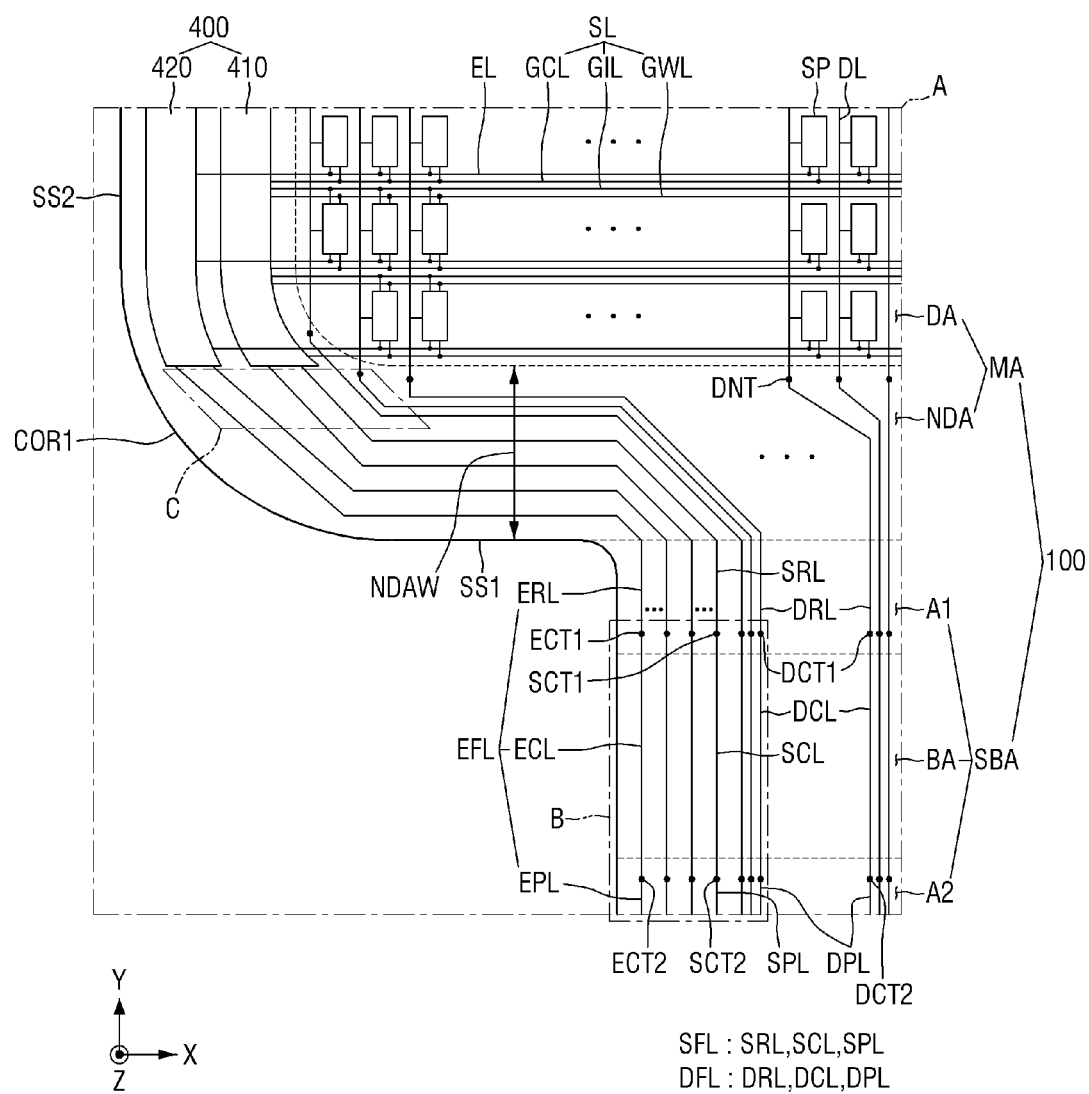
FIG. 5 is a layout view for illustrating pixels, scan lines, data lines, scan fan-out lines, light-emitting fan-out lines, data fan-out lines, and a scan driver of a display device according to an embodiment.

FIG. 5 is a layout view for illustrating pixels, scan lines, data lines, scan fan-out lines, light-emitting fan-out lines, data fan-out lines, and a scan driver of a display device according to an embodiment. FIG. 5 is a layout view specifically illustrating the area A of FIG. 2.

Referring to FIG. 5, the display area DA of the display panel 100 may include sub-pixels SP, scan lines SL, light emission lines EL, and data lines DL. The scan lines SL may include scan write lines GWL, scan control lines GCL, and scan initialization lines GIL. The scan write lines GWL, the scan control lines GCL, the scan initialization lines GIL, and the light emission lines EL may extend in the first direction (X-axis direction), and may be arranged in the second direction (Y-axis direction). The data lines DL may extend in the second direction (Y-axis direction), and may be arranged in the first direction (X-axis direction).

Each of the sub-pixels SP may be connected to the scan write line GWL, the scan control line GCL, the scan initialization line GIL, light emission lines EL, and the data line DL. Each of the sub-pixels SP may include a driving transistor (DT in FIG. 6), a plurality of switch elements, a light emitting element, and a capacitor. The plurality of switch elements may be controlled by the scan write line GWL, the scan control line GCL, and the scan initialization line GIL, and thus a data voltage of the data line DL may be applied to a gate electrode of the driving transistor. The driving transistor (DT in FIG. 6) may emit light by supplying a driving current to the light emitting element LEL according to the data voltage applied to the gate electrode. The light emitting element can emit light according to the driving current of the driving transistor (DT in FIG. 6). The light emitting element may be an organic light emitting diode including a first electrode, an organic light emitting layer, and a second electrode. Alternatively, the light emitting element may be an inorganic light emitting diode including a first electrode, an inorganic semiconductor, and a second electrode. Alternatively, the light emitting element may be an ultra-small light emitting diode of a micro unit or a nano unit. The capacitor may serve to maintain the data voltage applied to the gate electrode of the driving transistor DT for a predetermined period. The sub-pixel SP will be described later with reference to FIG. 6.

The non-display area NDA may be an area from the boundary of the display area DA to the edge of the display panel 100. The non-display area NDA may include a scan driver 400 for applying scan signals to the scan lines SL, scan fan-out lines SFL and light emission fan-out lines EFL connecting the scan driver 400 and the display driving circuit 200, and data fan-out lines DFL connecting the data lines DL of the display area DA and the display driving circuit 200.

The scan driver 400 may include a scan signal output unit 410 and a light emission signal output unit 420. The scan fan-out lines SFL may be connected to the scan signal output unit 410, and the light emission fan-out lines EFL may be connected to the light emission signal output unit 420.

The scan signal output unit 410 may be connected to the display driving circuit 200 through the scan fan-out lines SFL. The scan signal output unit 410 may receive a scan timing signal from the display driving circuit 200 through the scan fan-out lines SFL. The scan signal output unit 410 may generate scan write signals according to the received scan timing signal and sequentially output the scan write signals to the scan write lines GWL. The scan signal output unit 410 may generate scan control signals according to the scan timing signal and sequentially output the scan control signals to the scan control lines GCL. The scan signal output unit 410 may generate scan initialization signals according to the scan timing signal and sequentially output the scan initialization signals to the scan initialization lines GIL.

The light emission signal output unit 420 may be connected to the display driving circuit 200 through the light emission fan-out lines EFL. The light emission signal output unit 420 may receive a light emission timing signal from the display driving circuit 200 through the light emission fan-out lines EFL. The light emission signal output unit 420 may generate light emission signals according to the received light emission timing signal and sequentially output the light emission signals to the light emission lines EL.

Although it is illustrated in FIG. 5 that the scan driver 400 is disposed in the non-display area NDA at the left side of the display area DA, the present invention is not limited thereto. In another embodiment, for example, the scan driver 400 may be disposed in the non-display area NDA at both sides of the display area DA, for example, at the left and right sides of the display area DA.

The scan fan-out lines SFL, the light emission fan-out lines EFL, and the data fan-out lines DFL may be arranged in the non-display area NDA, and the first area A1, bending area BA and second area A2 of the sub-area SBA. In another embodiment, the non-display area NDA may be defined to include the sub-area SBA such that the non-display area NDA includes the scan fan-out lines SFL, the light emission fan-out lines EFL, and the data fan-out lines DFL.

Each of the scan fan-out lines SFL may include a scan routing line SRL, a scan connection line SCL, and a scan pad line SPL.

The scan routing line SRL may be disposed in the non-display area NDA and the first area A1. The scan routing line SRL may be disposed between the scan signal output unit 410 and the scan connection line SCL. One end of the scan routing line SRL may be connected to the scan signal output unit 410, and the other end of the scan routing line SRL may be connected to the scan connection line SCL.

The scan connection line SCL may be disposed in the first area A1, the bending area BA, and the second area A2. The scan connection line SCL may be disposed between the scan routing line SRL and the scan pad line SPL. One end of the scan connection line SCL may be connected to the scan routing line SRL through a first scan connection contact hole SCT1 in the first area A1, and the other end of the scan connection line SCL may be connected to the scan pad line SPL through a second scan connection contact hole SCT2 in the second area A2.

The scan pad line SPL may be disposed in the second area A2. The scan pad line SPL may be disposed between the scan connection line SCL and the display driving circuit 200 (refer to FIG. 2). One end of the scan pad line SPL may be connected to the scan connection line SCL, and the other end of the scan pad line SPL may be connected to the display driving circuit 200 (refer to FIG. 2).

Each of the light emission fan-out lines EFL may include a light emission routing line ERL, a light emission connection line ECL, and a light emission pad line EPL.

The light emission routing line ERL may be disposed in the non-display area NDA and the first area A1. The light emission routing line ERL may be disposed between the light emission signal output unit 420 and the light emission connection line ECL. One end of the light emission routing line ERL may be connected to the light emission signal output unit 420, and the other end of the light emission routing line ERL may be connected to the light emission connection line ECL through a first light emission connection contact hole ECT1 in the first area A1.

The light emission connection line ECL may be disposed in the first area A1, the bending area BA, and the second area A2. The light emission connection line ECL may be disposed between the light emission routing line ERL and the light emission pad line EPL. One end of the light emission connection line ECL may be connected to the light emission routing line ERL through the first light emission connection contact hole ECT1 in the first area A1, and the other end of the light emission connection line ECL may be connected to the light emission pad line EPL through a second light emission connection contact hole ECT2 in the second area A2.

The light emission pad line EPL may be disposed in the second area A2. The light emission pad line EPL may be disposed between the light emission connection line ECL and the display driving circuit 200 (refer to FIG. 2). One end of the light emission pad line EPL may be connected to the light emission connection line ECL through the second light emission connection contact hole ECT2 in the second area A2, and the other end of the light emission pad line EPL may be connected to the display driving circuit 200 (refer to FIG. 2).

Each of the data fan-out lines DFLs may include a data routing line DRL, a data connection line DCL, and a data pad line DPL.

The data routing line DRL may be disposed in the non-display area NDA and the first area A1. The data routing line DRL may be disposed between the data line DL and the data connection line DCL. One end of the data routing line DRL may be connected to the data line DL through a data contact hole DNT, and the other end of the data routing line DRL may be connected to the data connection line DCL through a first data connection contact hole DCT1.

The data connection line DCL may be disposed in the first area A1, the bending area BA, and the second area A2. The data connection line DCL may be disposed between the data routing line DRL and the data pad line DPL. One end of the data connection line DCL may be connected to the data routing line DRL through a first data connection contact hole DCT1 in the first area A1, and the other end of the data connection line DCL may be connected to the data pad line DPL through a second data connection contact hole DCT2 in the second area A2.

The data pad line DPL may be disposed in the second area A2. The data pad line DPL may be disposed between the data connection line DCL and the display driving circuit 200 (refer to FIG. 2). One end of the data pad line DPL may be connected to the data connection line DCL through the second data connection contact hole DCT2 in the second area A2, and the other end of the data pad line DPL may be connected to the display driving circuit 200 (refer to FIG. 2).

In an embodiment, a first corner COR1 where a first side SS1 and a second side SS2 of the main area MA of the display panel 100 meet each other may be rounded to have a predetermined curvature in a plan view. Here, the first side SS1 may be a short side of the main area MA which is connected to the sub-area SBA in the first direction (X-axis direction), and the second side SS2 may be a long side of the main area MA which is extended in the second direction (Y-axis direction). The scan driver 400 may be disposed in the non-display area NDA adjacent to the second side SS2 and the first corner COR1 of the display panel 100. Thus, the scan fan-out lines SFL, the light emission fan-out lines EFL, and the data fan-out lines DFL may be arranged in the non-display area NDA adjacent to the first side SS1 of the display panel 100 and the sub-area SBA. That is, many lines may be disposed in the non-display area NDA adjacent to the first side SS1 of the display panel 100. Further, each of the scan fan-out lines SFL, the light emission fan-out lines EFL, and the data fan-out lines DFL may be required to have a predetermined line width in consideration of line resistance (or line load). Therefore, it is difficult to reduce the width NDAW of the non-display area NDA adjacent to the first side SS1 of the display panel 100 in the second direction (Y-axis direction). As used herein, "width" of a line refers to a distance between two sides of the line in a latitudinal direction of the line in a plan view, unless otherwise stated.

In the non-display area NDA and the first area A1, the scan routing line SRL of the scan fan-out line SFL may include a plurality of sub-scan routing lines overlapping in the third direction (Z-axis direction) and connected to each other. Thus, even when the line width of the scan routing line SRL in the plane defined by the first and second directions (i.e., in the plan view) is reduced, it is possible to effectively prevent the line resistance of the scan routing line SRL from being reduced. Further, in the non-display area NDA and the first area A1, the light emission routing line ERL of the light emission fan-out line EFL may include a plurality of sub-light emission routing lines overlapping in the third direction (Z-axis direction) and connected to each other. Thus, even when the line width of the light emission routing line ERL in the plane defined by the first and second directions is reduced, it is possible to effectively prevent the line resistance of the light emission routing line ERL from being reduced. That is, the width NDAW of the non-display area NDA adjacent to the first side SS1 of the display panel 100 in the second direction (Y-axis direction) may be reduced by reducing the line width of each of the scan routing lines SRL and the light emission routing lines ERL in the plane defined by the first and second directions. Details thereof will be described later with reference to FIGS. 9 and 10.

In an embodiment, in FIG. 5, the scan fan-out line SFL, the light emission fan-out line EFL, and the data fan-out line DFL may be collectively referred to as a fan-out line. Further, the scan routing line SRL, the light emission routing line ERL, and the data routing line DRL may be collectively referred to as a routing line. Further, the scan connection line SCL, the light emission connection line ECL, and the data connection line DCL may be collectively referred to as a connection line. Moreover, the scan pad line SPL, the light emission pad line ELP, and the data pad line DPL may be collectively referred to as a pad line.

Figure 6:
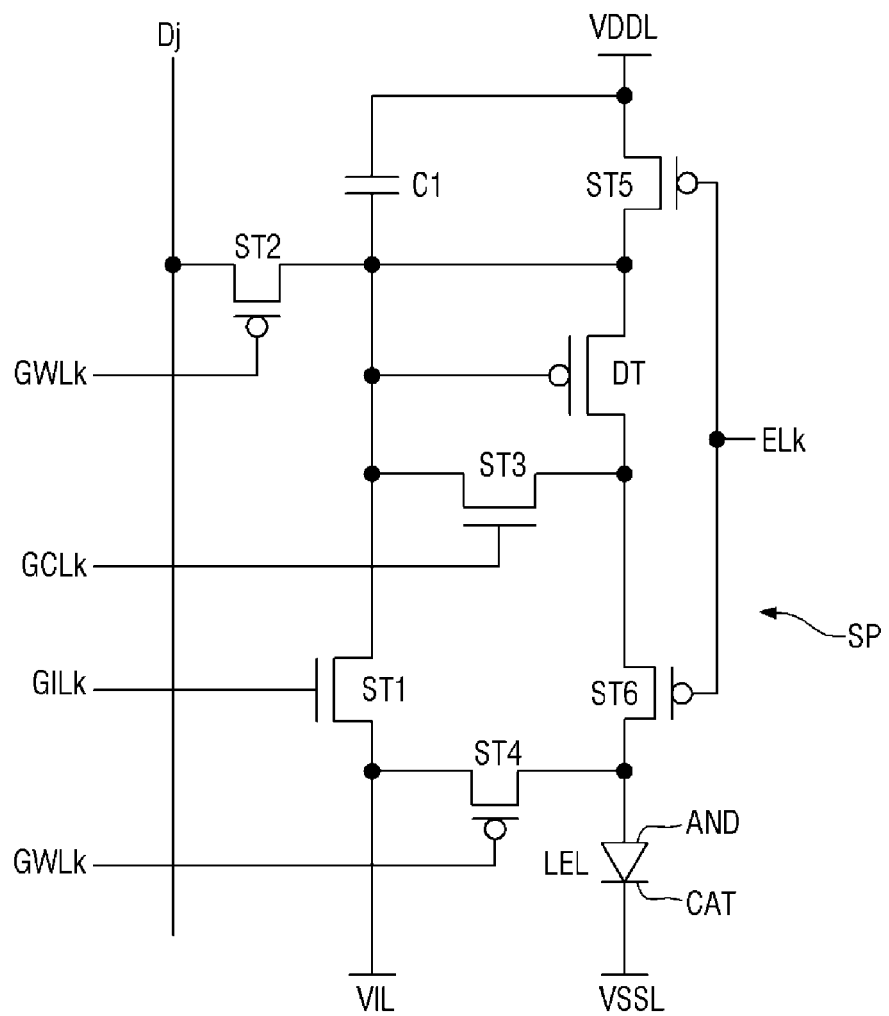
FIG. 6 is a circuit diagram illustrating an embodiment of a sub-pixel of the display device of FIG. 5.

FIG. 6 is a circuit diagram illustrating an embodiment of a sub-pixel of the display device of FIG. 5.

Referring to FIG. 6, the sub-pixel SP may be connected to a k-th (k is a positive integer) scan initialization line GILk, a k-th scan writing line GWLk, a k-th scan control line GCLk, and a j-th (j is a positive integer) data line DLj. Further, the sub-pixel SP may be connected to a first driving voltage line VDDL to which a first driving voltage is supplied, an initialization voltage line VIL to which an initialization voltage is supplied, and a second driving voltage line VSSL to which a second driving voltage is supplied.

The sub-pixel SP includes a driving transistor DT, a light emitting element LEL, switch elements, and a capacitor C1. The switch elements include first to sixth transistors ST1, ST2, ST3, ST4, ST5, and ST6.

The driving transistor DT may include a gate electrode, a first electrode, and a second electrode. The driving transistor DT controls a drain-source current (Ids, hereinafter referred to as "driving current") flowing between the first electrode and the second electrode according to the data voltage applied to the gate electrode.

The light emitting element LEL emits light according to the driving current Ids. The light emission amount of the light emitting element LEL may be proportional to the driving current Ids.

The light emitting element LEL may be an organic light emitting diode including an anode electrode, a cathode electrode, and an organic light emitting layer disposed between the anode electrode and the cathode electrode. Alternatively, the light emitting element LEL may be an inorganic light emitting element including an anode electrode, a cathode electrode, and an inorganic semiconductor disposed between the anode electrode and the cathode electrode. Alternatively, the light emitting element LEL may be a quantum dot light emitting element including an anode electrode, a cathode electrode, and a quantum dot light emitting layer disposed between the anode electrode and the cathode electrode. Alternatively, the light emitting element LEL may be a micro light emitting diode.

The anode electrode of the light emitting element EL may be connected to the first electrode of the fourth transistor ST4 and the second electrode of the sixth transistor ST6, and the cathode electrode of the light emitting element EL may be connected to the second driving voltage line VSSL. A parasitic capacitance Cel may be formed between the anode electrode and cathode electrode of the light emitting element EL.

The first transistor ST1 is turned on by the scan initialization signal of the k-th scan initialization line GILk to connect the gate electrode of the driving transistor DT and the initialization voltage line VIL. The gate electrode of the driving transistor DT may be discharged to the initialization voltage of the initialization voltage line VIL. The gate electrode of the first transistor ST1 may be connected to the k-th scan initialization line GILk, the first electrode the first transistor ST1 may be connected to the gate electrode of the driving transistor DT, and the second electrode the first transistor ST1 may be connected to the initialization voltage line VIL.

The second transistor ST2 is turned on by the scan write signal of the k-th scan write line GWLk to connect the first electrode of the driving transistor DT and the j-th data line Dj. The gate electrode of the second transistor ST2 may be connected to the k-th scan write line GWLk, the first electrode of the second transistor ST2 may be connected to the first electrode of the driving transistor DT, and the second electrode of the second transistor ST2 may be connected to the data line Dj.

The third transistor ST3 is turned on by the scan control signal of the k-th scan control line GCLk to connect the gate electrode and second electrode of the driving transistor DT. That is, when the third transistor ST3 is turned on, since the gate electrode and second electrode of the driving transistor DT are connected to each other, the driving transistor DT is driven as a diode. The gate electrode of the third transistor ST3 may be connected to the k-th scan control line GCLk, the first electrode of the third transistor ST3 may be connected to the second electrode of the driving transistor DT, and the second electrode of the third transistor ST3 may be connected to the gate electrode of the driving transistor DT.

The fourth transistor ST4 is turned on by the scan write signal of the k-th scan write line GWLk to connect the anode electrode AND of the light emitting element LEL and the initialization voltage line VIL. The anode electrode AND of the light emitting element LEL may be discharged to the initialization voltage. The gate electrode of the fourth transistor ST4 may be connected to the k-th scan write line GWLk, the first electrode of the fourth transistor ST4 may be connected to the anode electrode AND of the light emitting element LEL, and the second electrode of the fourth transistor ST4 may be connected to the initialization voltage line VIL.

The fifth transistor ST5 is turned on by the light emission control signal of the k-th light emission line ELk to connect the first electrode of the driving transistor DT and the first driving voltage line VDDL. The gate electrode of the fifth transistor ST5 may be connected to the k-th light emission line ELk, the first electrode of the fifth transistor ST5 may be connected to the first driving voltage line VDDL, and the second electrode of the fifth transistor ST5 may be connected to the source electrode of the driving transistor DT.

The sixth transistor ST6 is connected between the second electrode of the driving transistor DT and the anode electrode of the light emitting element LEL. The sixth transistor ST6 is turned on by the light emission control signal of the k-th light emission line ELk to connect the second electrode of the driving transistor DT and the anode electrode of the light emitting element LEL. The gate electrode of the sixth transistor ST6 may be connected to the k-th light emission line ELk, the first electrode of the sixth transistor ST6 may be connected to the second electrode of the driving transistor DT, and the second electrode of the sixth transistor ST6 may be connected to the anode electrode of the light emitting element LEL. When both the fifth transistor ST5 and the sixth transistor ST6 are turned on, the driving current Ids may be supplied to the light emitting element LEL.

The capacitor C1 is formed between the second electrode of the driving transistor DT and the first driving voltage line VDDL. One electrode of the capacitor C1 may be connected to the second electrode of the driving transistor DT, and the other electrode of the capacitor C1 may be connected to the first driving voltage line VDDL.

When the first electrode of each of the first to sixth transistors ST1, ST2, ST3, ST4, ST5, and ST6 and the driving transistor DT is a source electrode, the second electrode of each of the first to sixth transistors ST1, ST2, ST3, ST4, ST5, and ST6 and the driving transistor DT may be a drain electrode. Alternatively, when the first electrode of each of the first to sixth transistors ST1, ST2, ST3, ST4, ST5, and ST6 and the driving transistor DT is a drain electrode, the second electrode of each of the first to sixth transistors ST1, ST2, ST3, ST4, ST5, and ST6 and the driving transistor DT may be a source electrode.

The active layer of each of the first to sixth transistors ST1, ST2, ST3, ST4, ST5, and ST6 and the driving transistor DT may include or be formed of any one of a silicon semiconductor such as polysilicon or amorphous silicon and an oxide semiconductor. For example, the active layer of each of the driving transistor DT, the second transistor ST2, the fourth transistor ST4, the fifth transistor ST5, and the sixth transistor ST6, which are formed as P-type MOSFETs, may include or be formed of a silicon semiconductor, and the active layer of each of the first transistor ST1 and the third transistor ST3, which are formed as N-type MOSFETs, may include or be formed of an oxide semiconductor.

Figure 7:
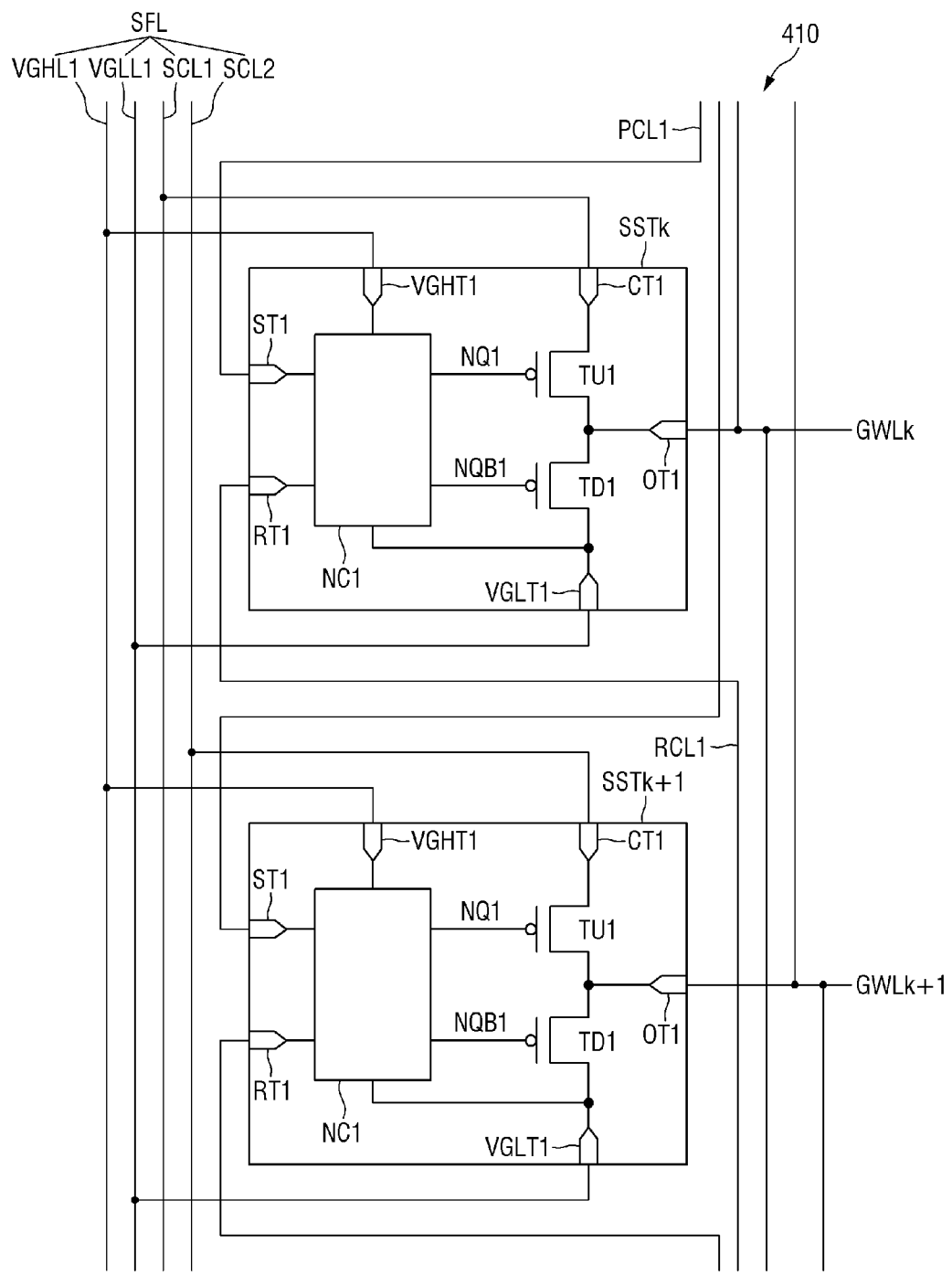
FIG. 7 is a circuit diagram illustrating an embodiment of a scan signal output unit of the scan driver of FIG. 5.

FIG. 7 is a circuit diagram illustrating an embodiment of a scan signal output unit of the scan driver of FIG. 5.

For convenience of explanation, in FIG. 7, only a k-th scan stage SSTk connected to the k-th scan write line GWLk of the scan signal output unit 410 and a k+1th scan stage SSTk+1 connected to the k+1th scan write line GWLk+1 of the scan signal output unit 410.

Referring to FIG. 7, the scan signal output unit 410 includes scan stages SSTk and SSTk+1 that are dependently connected to each other. The scan stages SSTk and SSTk+1 may sequentially output scan signals. For example, the k-th scan stage SSTk may be connected to the k-th scan write line GWLk to output a k-th scan signal. The k+1th scan stage SSTk+1 may be connected to the k+1th scan write line GWLk+1 to output a k+1th scan signal.

Each of the scan stages SSTk and SSTk+1, as shown in FIG. 7, includes a first pull-up node NQ1, a first pull-down node NQB1, a first pull-up transistor TU1 turned on when the first pull-up node NQ1 has a first gate-on voltage, a first pull-down transistor TD1 turned on when the first pull-down node NQB1 has a first gate-on voltage, and a first node control unit NC1 for controlling the charging and discharging of the first pull-up node NQ1 and the first pull-down node NQB1. The scan fan-out lines SFL connected to the scan stages SSTk and SSTk+1 include a scan start signal line to which a scan start signal is applied, scan clock lines SCL1 and SCL2 to which scan clock signals are applied, a first gate-on voltage line VGHL1, and a first gate-off voltage line VGLL1.

The first node control unit NC1 includes a first start terminal STR1, a first reset terminal RT1, a first gate-on voltage terminal VGHT1, a first gate-off voltage terminal VGLT1, a first clock terminal CT1, and a first output terminal OT1. The first start terminal STR1 may be connected to a scan start line to which a scan start signal is applied or a first front carry line PCL1 to which an output signal of a front stage is applied. The first reset terminal RT1 may be connected to a first rear end carry line RCL1 to which an output signal of a rear stage is input. The first gate-on voltage terminal VGHT1 may be connected to the first gate-on voltage line VGHL1 to which a first gate-on voltage is applied. The first gate-off voltage terminal VGLT1 may be connected to the first gate-off voltage line VGLL1 to which a gate-off voltage is applied. The first gate-on voltage may be a first level voltage V1, and the first gate-off voltage may be a second level voltage. The first node control unit NC1 includes a plurality of thin film transistors.

The first clock terminal CT1 may be connected to any one of the first scan clock line SCL1 to which a scan clock signal is applied and the second scan clock line SCL2 to which a second scan clock signal is applied. The stages SSTk and SSTk+1 may be alternately connected to the first scan clock line SCL1 and the second scan clock line SCL2. For example, when the first clock terminal CT1 of the k-th scan stage SSTk is connected to the first scan clock line SCL1, the first clock terminal CT1 of the k+1th scan stage SSTk+1 may be connected to the second scan clock line SCL2. Although it is illustrated in FIG. 7 that the stages SSTk and SSTk+1 are alternately connected to the two scan clock lines SCL1 and SCL2, the present invention is not limited thereto. For example, the stages SSTk and SSTk+1 may be alternately connected to three or more scan clock lines.

The first output terminal OT1 may be connected to any one of the scan lines SLk and SLk+1. The stages SSTk and SSTk+1 may be sequentially connected to the scan lines SLk and SLk+1. For example, the first output terminal OT1 of the k-th stage SSTk may be connected to the k-th scan write line GWLk, and the first output terminal OT1 of the k+1th stage SSTk+1 may be connected to the k+1th scan write line GWLk+1.

Although it is illustrated in FIG. 7 that the first pull-up transistor TU1 and first pull-down transistor TD1 of each of the stages SSTk and SSTk+1, and the plurality of transistors of the first node control unit NC1 are P-type MOSFETs, embodiments of the present specification are not limited thereto. That is, the first pull-up transistor TU1 and first pull-down transistor TD1 of each of the stages SSTk and SSTk+1, and the plurality of transistors of the first node control unit NC1 may be N-type MOSFETs.

Figure 8:
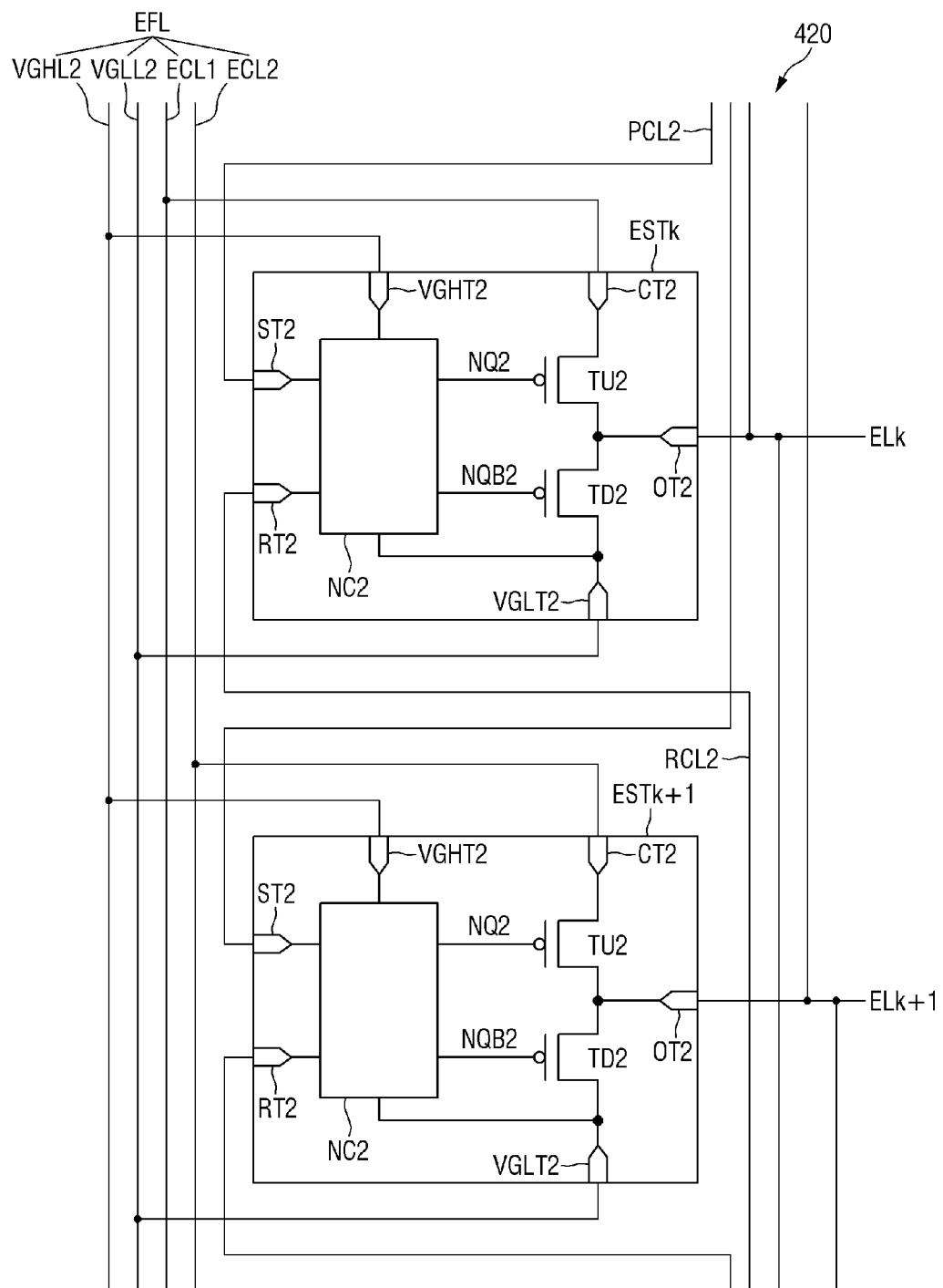
FIG. 8 is a circuit diagram illustrating an embodiment of a light emission signal output unit of the scan driver of FIG. 5.

FIG. 8 is a circuit diagram illustrating an embodiment of a light emission signal output unit of the scan driver of FIG. 5.

For convenience of explanation, in FIG. 8, only a k-th light emission stage ESTk connected to the k-th light emission line ELk of the light emission signal output unit 420 and a k+1th light emission stage ESTk+1 connected to the k+1th light emission line ELk+1 of the light emission signal output unit 420.

Referring to FIG. 8, the light emission signal output unit 420 includes light emission stages ESTk and ESTk+1 that are dependently connected to each other. The light emission stages ESTk and ESTk+1 may sequentially output light emission signals. For example, the k-th light emission stage ESTk may be connected to the k-th light emission line ELk to output a k-th light emission signal. The k+1th light emission stage ESTk+1 may be connected to the k+1th light emission line ELk+1 to output a k+1th light emission signal.

Each of the light emission stages ESTk and ESTk+1, as shown in FIG. 8, includes a second pull-up node NQ2, a second pull-down node NQB2, a second pull-up transistor TU2 turned on when the second pull-up node NQ2 has a second gate-on voltage, a second pull-down transistor TD2 turned on when the second pull-down node NQB2 has a second gate-on voltage, and a second node control unit NC2 for controlling the charging and discharging of the second pull-up node NQ2 and the second pull-down node NQB2. The light emission fan-out lines EFL connected to the light emission stages ESTk and ESTk+1 include a light emission start signal line to which a light emission start signal is applied, light emission clock lines ECL1 and ECL2 to which light emission clock signals are applied, a second gate-on voltage line VGHL2, and a second gate-off voltage line VGLL2.

Since the light emission stages ESTk and ESTk+1 receive light emission start signals different from scan start signals and light emission clock signals different from scan clock signals, the light emission stages ESTk and ESTk+1 are different from the scan stages SSTk and SSTk+1 descried with reference to FIG. 7 in that light emission signals different from scan signals are output. Therefore, in FIG. 7, details of the light emission stages ESTk and ESTk+1 are omitted.

Figure 9:
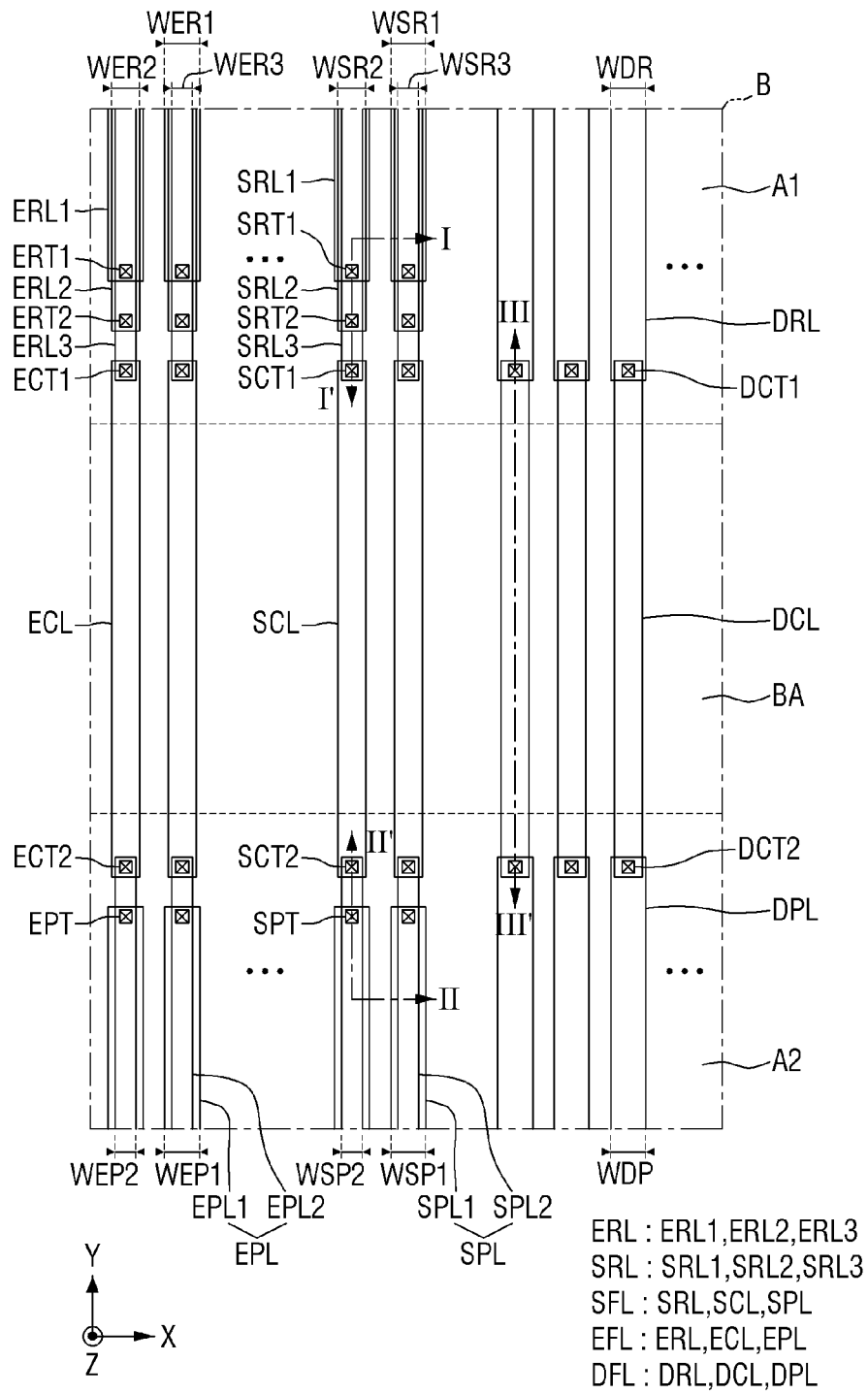
FIG. 9 is a layout view specifically illustrating an embodiment of the area B in FIG. 5.
Figure 10:
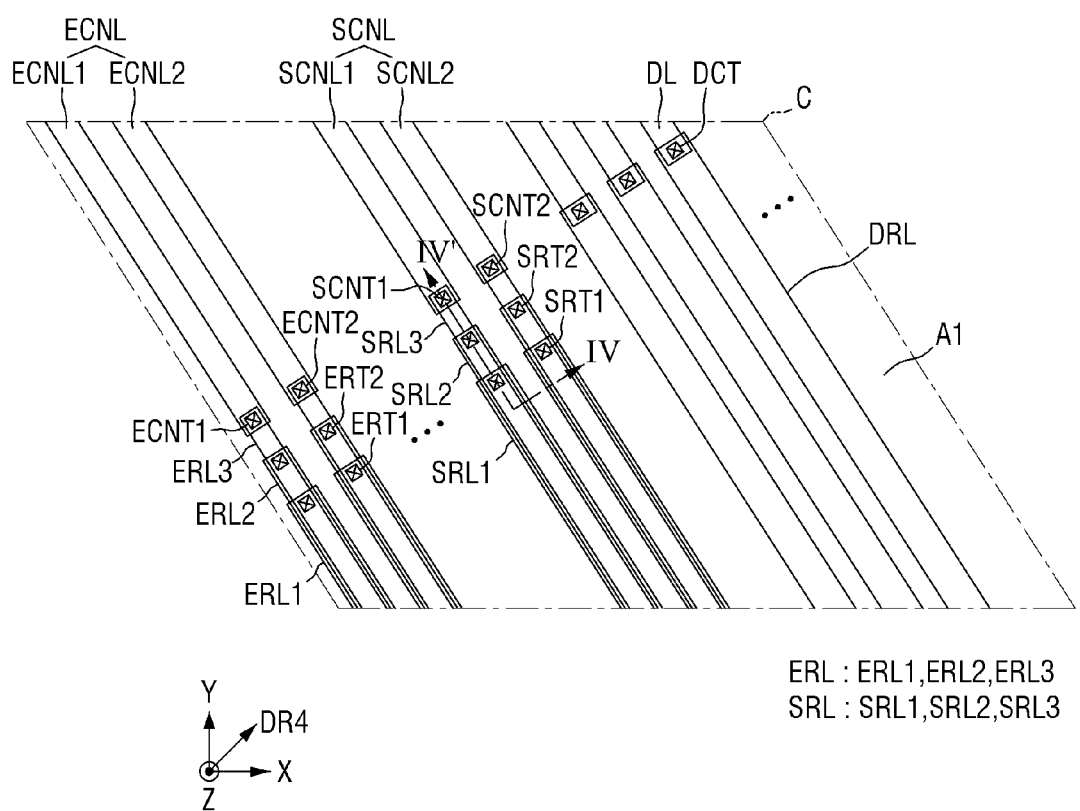
FIG. 10 is a layout view specifically illustrating an embodiment of the area C in FIG. 5.

FIG. 9 is a layout view specifically illustrating an embodiment of the area B in FIG. 5, and FIG. 10 is a layout view specifically illustrating an embodiment of the area C in FIG. 5.

FIGS. 9 and 10 illustrate scan fan-out lines SFL, light emission fan-out lines EFL, and data fan-out lines DFL arranged in the area B and area C. The area B corresponds to a part of the first area A1, the bending area BA, and the second area A2. The area C corresponds to a part of the non-display area NDA adjacent to the first side SS1 of the display panel 100 and a part of the first corner COR1.

Referring to FIGS. 9 and 10, each of the scan fan-out lines SFLs may include a scan routing line SRL, a scan connection line SCL, and a scan pad line SPL. The scan routing line SRL may include a plurality of sub-scan routing lines SRL1 to SRL3 arranged on a plurality of layers. The scan pad line SPL may include a plurality of sub-scan pad lines SPL1 and SPL2 arranged on a plurality of layers. The scan connection line SCL may be a single layer.

The scan routing line SRL may include a first sub-scan routing line SRL1, a second sub-scan routing line SRL2, and a third sub-scan routing line SRL3.

The first sub-scan routing line SRL1, the second sub-scan routing line SRL2, and the third sub-scan routing line SRL3 may overlap each other in the third direction (Z-axis direction). The second sub-scan routing line SRL2 may be disposed on the first sub-scan routing line SRL1, and the third sub-scan routing line SRL3 may be disposed on the second sub-scan routing line SRL2 (See FIG. 12).

The first sub-scan routing line SRL1, the second sub-scan routing line SRL2, and the third sub-scan routing line SRL3 may be electrically connected to each other. The second sub-scan routing line SRL2 may be connected to the first sub-scan routing line SRL1 through a first scan routing contact hole SRT1. The third sub-scan routing line SRL3 may be connected to the second sub-scan routing line SRL2 through a second scan routing contact hole SRT2.

The scan pad line SPL may include a first sub-scan pad line SPL1 and a second sub-scan pad line SPL2.

The first sub-scan pad line SPL1 and the second sub-scan pad line SPL2 may overlap each other in the third direction (Z-axis direction). The second sub-scan pad line SPL2 may be disposed on the first sub-scan pad line SPL1 (See FIG. 13).

The first sub-scan pad line SPL1 and the second sub-scan pad line SPL2 may be electrically connected to each other. The second sub-scan pad line SPL2 may be connected to the first sub-scan pad line SPL1 through a scan pad contact hole SPT.

The scan connection line SCL may be connected to the third sub-scan routing line SRL3 through a first scan connection contact hole SCT1 in the first area A1. The scan connection line SCL may be connected to the second sub-scan pad line SPL2 through a second scan connection contact hole SCT2 in the second area A2.

The scan control lines SCNL may include first sub-scan control lines SCNL1 and second sub-scan control lines SCNL2 that are arranged alternately in the fourth direction DR4 as shown in FIG. 10. The fourth direction DR4 may be a diagonal direction between the first direction (X-axis direction) and the second direction (Y-axis direction). The first sub-scan control line SCNL1 and the second sub-scan control line SCNL2 may be disposed on different layers.

The first sub-scan control line SCNL1 may be connected to a third sub-scan routing line SRL3 through a first scan control contact hole SCNT1 in the non-display area NDA. The second sub-scan control line SCNL2 may be connected to another third sub-scan routing line SRL3, which is different from the third sub-scan routing line SRL3 connected to the first sub-scan control line SCNL1, through a second scan control contact hole SCNT2 in the non-display area NDA.

The number of the sub-scan routing lines SRL1 to SRL3 may be greater than the number of the sub-scan pad lines SPL1 and SPL2. Thus, the maximum line width of each of the scan fan-out lines SFL in the non-display area NDA and the first area A1 may be minimized.

In an embodiment, for example, the line width WSR1 of the first sub-scan routing line SRL1 in the first direction (X-axis direction) may be wider than the line width WSR2 of the second sub-scan routing line SRL2 in the first direction (X-axis direction) at the same point in the plan view. The line width WSR2 of the second sub-scan routing line SRL2 in the first direction (X-axis direction) may be wider than the line width WSR3 of the third sub-scan routing line SRL3 in the first direction (X-axis direction) at the same point in the plan view. The line width WSP1 of the first sub-scan pad line SPL1 in the first direction may be wider than the line width WSP2 of the second sub-scan pad line SPL2 in the first direction at the same point in the plan view. The maximum line width of the scan fan-out line SFL in the non-display area NDA and the first area A1 may be the line width WSR1 of the first sub-scan routing line SRL1 in the first direction. The maximum line width of the scan fan-out line SFL in the second area A2 may be the line width WSP1 of the first sub-scan pad line SPL1 in the first direction. Therefore, the line width WSR1 of the first sub-scan routing line SRL1 may be smaller than the line width WSP1 of the first sub-scan pad line SPL1.

Each of the light emission fan-out lines EFLs may include a light emission routing line ERL, a light emission connection line ECL, and a light emission pad line EPL. The light emission routing line ERL may include a plurality of sub-light emission routing lines ERL1 to ERL3 arranged on a plurality of layers stacked in the third direction. The light emission pad line EPL may include a plurality of sub-light emission pad lines EPL1 and EPL2 arranged on a plurality of layers.

The light emission routing line ERL may include a first sub-light emission routing line ERL1, a second sub-light emission routing line ERL2, and a third sub-light emission routing line ERL3.

The first sub-light emission routing line ERL1, the second sub-light emission routing line ERL2, and the third sub-light emission routing line ERL3 may overlap each other in the third direction (Z-axis direction). The second sub-light emission routing line ERL2 may be disposed on the first sub-light emission routing line ERL1, and the third sub-light emission routing line ERL3 may be disposed on the second sub-light emission routing line ERL2 in the plan view.

The second sub-light emission routing line ERL2 may be connected to the first sub-light emission routing line ERL1 through a first light emission routing contact hole ERT1. The third sub-light emission routing line ERL3 may be connected to the second sub-light emission routing line ERL2 through a second light emission routing contact hole ERT2.

The light emission pad line EPL may include a first sub-light emission pad line EPL1 and a second sub-light emission pad line EPL2.

The first sub-light emission pad line EPL1 and the second sub-light emission pad line EPL2 may overlap each other in the third direction (Z-axis direction). The second sub-light emission pad line EPL2 may be disposed on the first sub-light emission pad line EPL1. The second sub-light emission pad line EPL2 may be connected to the first sub-light emission pad line EPL1 through a light emission pad contact hole EPT. The light emission connection line ECL may be connected to the third sub-light emission routing line ERL3 through a first light emission connection contact hole ECT1 in the first area A1. The light emission connection line ECL may be connected to the second sub-light emission pad line ELP2 through a second light emission connection contact hole ECT2 in the second area A2.

The light emission control lines ECNL may include first sub-light emission control lines ECNL1 and second sub-light emission control lines ECNL2 that are arranged alternately in the fourth direction DR4 as shown in FIG. 10. The fourth direction DR4 may be a diagonal direction between the first direction (X-axis direction) and the second direction (Y-axis direction). The first sub-light emission control line SCNL1 and the second sub-light emission control line SCNL2 may be disposed on different layers.

The first sub-light emission control line ECNL1 may be connected to a third sub-light emission routing line ERL3 through a first light emission control contact hole ECNT1 in the non-display area NDA. The second sub-light emission control line ECNL2 may be connected to another third sub-light emission routing line ERL3, which is different from the third sub-light emission routing line ERL3 connected to the first sub-light emission control line ECNL1, through a second light emission control contact hole ECNT2 in the non-display area NDA.

The number of the sub-light emission routing lines ERL1 to ERL3 may be greater than the number of the sub-light emission pad lines EPL1 and EPL2. Thus, the maximum line width of each of the light emission fan-out lines EFL in the non-display area NDA adjacent to the first side SS1 of the display panel 100 may be minimized.

In an embodiment, for example, the line width WER1 of the first sub-light emission routing line ERL1 may be wider than the line width WER2 of the second sub-light emission routing line ERL2 at the same point in the plan view. The line width WER2 of the second sub-light emission routing line ERL2 may be wider than the line width WER3 of the third sub-light emission routing line ERL3 at the same point in the plan view. The line width WEP1 of the first sub-light emission pad line EPL1 may be wider than the line width WEP2 of the second sub-light emission pad line EPL2 at the same point in the plan view. The maximum line width of the light emission fan-out line EFL in the non-display area NDA and the first area A1 may be the line width WER1 of the first sub-light emission routing line ERL1. The maximum line width of the light emission fan-out line EFL in the second area A2 may be the line width WEP1 of the first sub-light emission pad line EPL1. Therefore, the line width WER1 of the first sub-light emission routing line ERL1 may be smaller than the line width WEP1 of the first sub-light emission pad line EPL1 in the first direction.

Each of the data fan-out lines DFL may include a data routing line DRL, a data connection line DCL, and a data pad line DPL.

The data connection line DCL may be connected to the data routing line DRL through a first data connection contact hole DCT1 in the first area A1. The data connection line DCL may be connected to the data pad line DPL through a second data connection contact hole DCT2 in the second area A2. The data line DL may be connected to the data routing line DRL through a data contact hole DCT in the non-display area NDA.

Since the data routing line DRL is a single layer, in order to effectively prevent the line resistance of the data routing line DRL from being lowered, the line width WDR of the data routing line DRL may be wider than the line width WSR1 of the first sub-scan routing line SRL1 at the same point in the plan view. The line width WDR of the data routing line DRL may be wider than the line width WER1 of the first sub-light emission routing line ERL1 at the same point in the plan view.

Since the data pad line DPL is a single layer, in order to effectively prevent the line resistance of the data pad line DPL from being lowered, the line width WDP of the data pad line DPL may be wider than the line width WSP1 of the first sub-scan pad line SPL1 at the same point in the plan view. The line width WDP of the data pad line DPL may be wider than the line width WEP1 of the first sub-light emission pad line EPL1 at the same point in the plan view.

As shown in FIGS. 9 and 10, in the non-display area NDA and the first area A1, the scan routing line SRL of the scan fan-out line SFL may include a plurality of sub-scan routing lines SRL1 to SRL3 overlapping in the third direction (Z-axis direction). Thus, even when the line widths of the plurality of sub-scan routing lines SRL1 to SRL3 of the scan routing line SRL in the plane defined by the first and second directions is reduced, it is possible to effectively prevent the line resistance of the scan routing line SRL from being reduced. Further, in the non-display area NDA and the first area A1, the light emission routing line ERL of the light emission fan-out line EFL may include a plurality of sub-light emission routing lines ERL1 to ERL3 overlapping in the third direction (Z-axis direction). Thus, even when the line width of the light emission routing line ERL in the plane defined by the first and second directions is reduced, it is possible to effectively prevent the line resistance of the light emission routing line ERL from being reduced. Accordingly, the line width of each of the scan routing lines SRL and the light emission routing lines ERL in the plane defined by the first and second directions may be reduced, thereby reducing the width NDAW of the non-display area NDA adjacent to the first side SS1 of the display panel 100 in the second direction (Y-axis direction).

Figure 11:
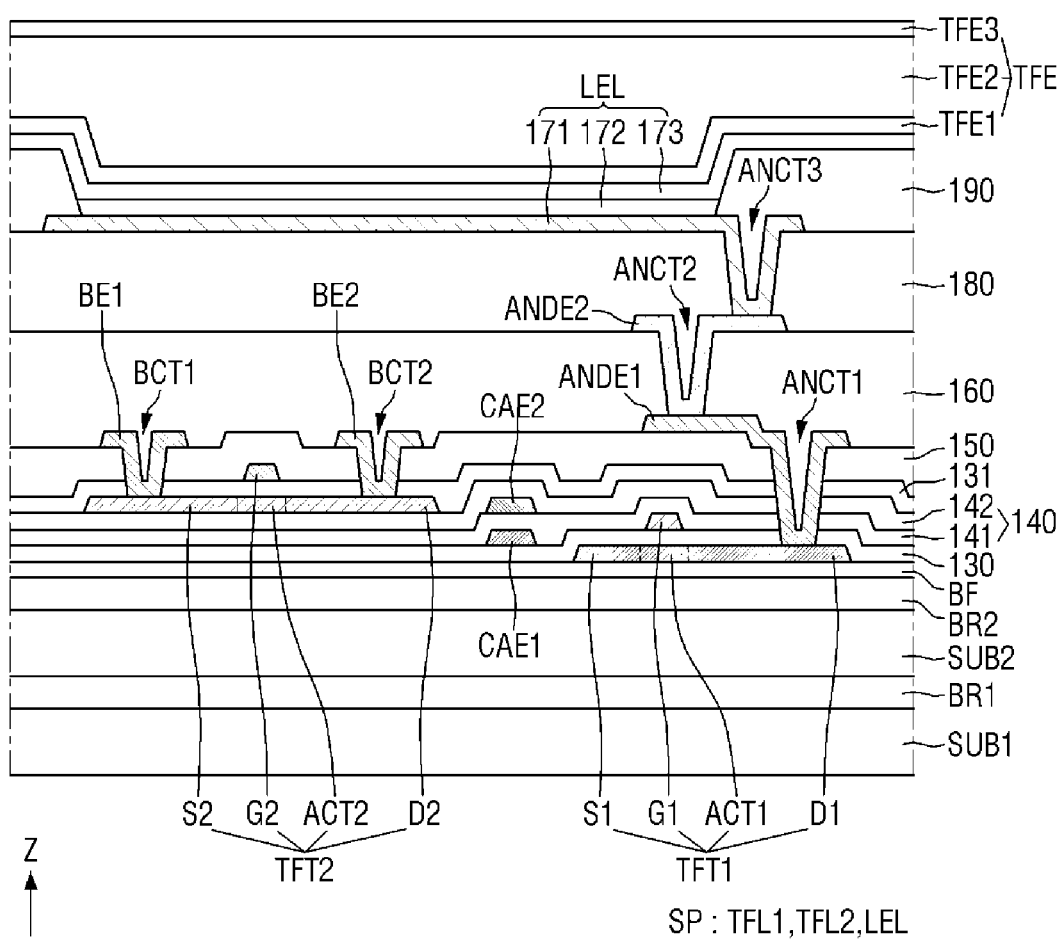
FIG. 11 is a cross-sectional view illustrating a first thin film transistor, a second thin film transistor, and a light emitting element of the sub-pixel of FIG. 6.

FIG. 11 is a cross-sectional view illustrating a first thin film transistor, a second thin film transistor, and a light emitting element of the sub-pixel of FIG. 6.

Referring to FIG. 11, each of the sub-pixels SP displaying an image may include a first thin film transistor TFT1, a second thin film transistor TFT2, and a light emitting element LEL. The first thin film transistor TFT1 may be the sixth transistor ST6 of FIG. 6, and the second thin film transistor TFT2 may be the first transistor ST1 or third transistor ST3 of FIG. 6. That is, for convenience of explanation, FIG. 11 illustrates only some of the driving transistor DT and first to sixth transistors ST1 to ST6 of FIG. 6.

A first barrier film BR1 may be disposed on a first substrate SUB1, a second substrate SUB2 may be disposed on the first barrier film BR1, and a second barrier film BR2 may be disposed on the second substrate SUB2.

Each of the first substrate SUB1 and the second substrate SUB2 may include or be made of an insulating material such as a polymer resin. For example, each of the first substrate SUB1 and the second substrate SUB2 may include polyimide. Each of the first substrate SUB1 and the second substrate SUB2 may be a flexible substrate capable of bending, folding, rolling, or the like.

Each of the first barrier film BR1 and the second barrier film BR2 may be a film for protecting a thin film transistor of a thin film transistor layer and a light emitting layer 172 of a light emitting element LEL from moisture penetrating through the first substrate SUB1 and the second substrate SUB2, which are vulnerable to moisture permeation. Each of the first barrier film BR1 and the second barrier film BR2 may include or be formed of a plurality of alternately stacked inorganic films. For example, each of the first barrier film BR1 and the second barrier film BR2 may be a multi-layer film in which one or more inorganic layers of a silicon nitride layer, a silicon oxynitride layer, a silicon oxide layer, a titanium oxide layer, and an aluminum oxide layer are alternately stacked.

A buffer film BF may be disposed on the second barrier film BR2. The buffer film BF may include or be formed of a silicon nitride layer, a silicon oxy nitride layer, a silicon oxide layer, a titanium oxide layer, or an aluminum oxide layer.

A first thin film transistor TFT1 and a second thin film transistor TFT2 may be disposed on the buffer film BF. The first thin film transistor TFT1 may include a first active layer ACT1, a first gate electrode G1, a first source electrode S1, and a first drain electrode D1. The second thin film transistor TFT2 may include a second active layer ACT2, a second gate electrode G2, a second source electrode S2, and a second drain electrode D2.

The first active layer ACT1, the first source electrode S1, and the first drain electrode D1 of the first thin film transistor TFT1 may be disposed on the buffer film BF. The first active layer ACT1 may include a silicon semiconductor such as polycrystalline silicon, monocrystalline silicon, low-temperature polycrystalline silicon, or amorphous silicon. Each of the first source electrode S1 and the first drain electrode D1 may have conductivity because it includes a silicon semiconductor doped with ions or impurities. The first active layer ACT1 may overlap the first gate electrode G1 in the third direction (Z-axis direction), which is a thickness direction of the first substrate SUB1 and the second substrate SUB2, and the first source electrode S1 and the first drain electrode D1 may not overlap the first gate electrode G1 in the third direction (Z-axis direction).

A first gate insulating film 130 may be disposed on the first active layer ACT1, the first source electrode S1, and the first drain electrode D1 of the first thin film transistor TFT1. The first gate insulating film 130 may include or be formed of an inorganic layer, for example, a silicon nitride layer, a silicon oxy nitride layer, a silicon oxide layer, a titanium oxide layer, or an aluminum oxide layer.

The first gate electrode G1 of the first thin film transistor TFT1 and a first capacitor electrode CAE1 may be disposed on the first gate insulating film 130. The first gate electrode G1 may overlap the first active layer ACT1 in the third direction (Z-axis direction). The first capacitor electrode CAE1 may overlap a second capacitor electrode CAE2 in the third direction (Z-axis direction). The first gate electrode G1 may be a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A first interlayer insulating film 141 may be disposed on the first gate electrode G1 and the first capacitor electrode CAE1. The first interlayer insulating film 141 may include or be formed of an inorganic layer, for example, a silicon nitride layer, a silicon oxy nitride layer, a silicon oxide layer, a titanium oxide layer, or an aluminum oxide layer.

The second capacitor electrode CAE2 may be disposed on the first interlayer insulating film 141. Since the first interlayer insulating film 141 has a predetermined dielectric constant, a capacitor may be formed by the first capacitor electrode CAE1, the second capacitor electrode CAE2, and the first interlayer insulating film 141 between the first capacitor electrode CAE1 and the second capacitor electrode CAE2. The second capacitor electrode CAE2 may be a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A second interlayer insulating film 142 may be disposed on the second capacitor electrode CAE2. The second interlayer insulating film 142 may include or be formed of an inorganic layer, for example, a silicon nitride layer, a silicon oxy nitride layer, a silicon oxide layer, a titanium oxide layer, or an aluminum oxide layer. The second interlayer insulating film 142 may include a plurality of inorganic layers, and the thickness of the second interlayer insulating film 142 in the third direction (Z-axis direction) may be greater than the thickness of the first interlayer insulating film 141 in the third direction (Z-axis direction).

The second active layer ACT2, the second source electrode S2, and the second drain electrode D2 of the second thin film transistor TFT2 may be disposed on the second interlayer insulating film 142. The second active layer ACT2 may include an oxide semiconductor. Each of the second source electrode S2 and the second drain electrode D2 may have conductivity because it includes an oxide semiconductor doped with ions or impurities. The second active layer ACT2 may overlap the second gate electrode G2 in the third direction (Z-axis direction), and the second source electrode S2 and the second drain electrode D2 may not overlap the second gate electrode G2 in the third direction (Z-axis direction).

A second gate insulating film 131 may be disposed on the second active layer ACT2, the second source electrode S2, and the second drain electrode D2 of the second thin film transistor TFT2. The second gate insulating film 131 may include or be formed of an inorganic layer, for example, a silicon nitride layer, a silicon oxy nitride layer, a silicon oxide layer, a titanium oxide layer, or an aluminum oxide layer.

The second gate electrode G2 of the second thin film transistor TFT2 may be disposed on the second gate insulating film 131. The second gate electrode G2 may overlap the second active layer ACT2 in the third direction (Z-axis direction). The second gate electrode G2 may be a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A third interlayer insulating film 150 may be disposed on the second gate electrode G2. The third interlayer insulating film 150 may include or be formed of an inorganic layer, for example, a silicon nitride layer, a silicon oxy nitride layer, a silicon oxide layer, a titanium oxide layer, or an aluminum oxide layer. The third interlayer insulating film 150 may include a plurality of inorganic layers.

A first anode connection electrode ANDE1, a first connection electrode BE1, and a second connection electrode BE2 may be disposed on the third interlayer insulating film 150.

The first anode connection electrode ANDE1 may be connected to the first drain electrode D1 through a first anode contact hole ANCT1 penetrating the interlayer insulating film 140 and the third interlayer insulating film 150 to expose the first drain electrode D1 of the first thin film transistor TFT1. The interlayer insulating film 140 may include the first interlayer insulating film 141 and the second interlayer insulating film 142. The first connection electrode BE1 may be connected to the second source electrode S2 through a first connection contact hole BCT1 penetrating the third interlayer insulating film 150 to expose the second source electrode S2 of the second thin film transistor TFT2. The second connection electrode BE2 may be connected to the second drain electrode D2 through a second connection contact hole BCT2 penetrating the third interlayer insulating film 150 to expose the second drain electrode D2 of the second thin film transistor TFT2.

The first anode connection electrode ANDE1, the first connection electrode BE1, and the second connection electrode BE2 may be a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A first organic film 160 for planarization may be disposed on the first anode connection electrode ANDE1, the first connection electrode BE1, and the second connection electrode BE2. The first organic film 160 may include or be formed of an acrylic resin, an epoxy resin, a phenolic resin, a polyamide resin, or a polyimide resin.

A second anode connection electrode ANDE2 may be disposed on the first organic film 160. The second anode connection electrode ANDE2 may be connected to the first anode connection electrode ANDE1 through a second anode contact hole ANCT2 penetrating the first organic film 160 to expose the first anode connection electrode ANDE1. The second anode connection electrode ANDE2 may be a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A second organic film 180 may be disposed on the second anode connection electrode ANDE2. The second organic film 180 may include or be formed of an acrylic resin, an epoxy resin, a phenolic resin, a polyamide resin, or a polyimide resin.

Although it is illustrated in FIG. 6 that the first thin film transistor TFT1 and the second thin film transistor TFT2 are formed by a top gate method in which a gate electrode is located over an active layer, the present invention is not limited thereto. That is, the first thin film transistor TFT1 and the second thin film transistor TFT2 may be formed by a bottom gate method in which a gate electrode is located under an active layer or a double gate method in which gate electrodes are located over and under an active layer.

Light emitting elements LEL and a bank 190 may be disposed on the second organic film 180. Each of the light emitting elements LEL includes a first light emitting electrode 171, a light emitting layer 172, and a second light emitting electrode 173. The first light emitting electrode 171 may be the anode electrode AND of FIG. 6, and the second light emitting electrode 173 may be the cathode electrode CAT of FIG. 6.

The first light emitting electrode 171 may be disposed on the second organic film 180. The first light emitting electrode 171 may be connected to the second anode connection electrode ANDE2 through a third anode contact hole ANCT3 penetrating the second organic film 180 to expose the second anode connection electrode ANDE2.

In a top emission structure in which light is emitted from the light emitting layer 172 toward the second light emitting electrode 173, the first light emitting electrode 171 may include a metal material having high reflectance such as a laminated structure (Ti/Al/Ti) of aluminum and titanium, a laminated structure ("ITO"/Al/ITO) of aluminum and ITO, an APC alloy, or a laminated structure (ITO/APC/ITO) of an APC alloy and ITO. The APC alloy refers to an alloy of silver (Ag), palladium (Pd), and copper (Cu).

The bank 190 may partition the first light emitting electrode 171 on the second organic film 180 in order to serve to define a light emitting area EA. The bank 190 may include or be formed of an acrylic resin, an epoxy resin, a phenolic resin, a polyamide resin, or a polyimide resin.

The light emitting area EA is an area where the first light emitting electrode 171, the light emitting layer 172, and the second light emitting electrode 173 are sequentially stacked, and holes from the first light emitting electrode 171 are combined with electrodes from the second light emitting electrode 173 to emit light.

The light emitting layer 172 is disposed on the first light emitting electrode 171 and the bank 190. The light emitting layer 172 may include an organic material to emit light of a predetermined color. For example, the light emitting layer 172 includes a hole transporting layer, an organic material layer, and an electron transporting layer.

The second light emitting electrode 173 is disposed on the light emitting layer 172. The second light emitting electrode 173 may cover the light emitting layer 172. The second light emitting electrode 173 may be a common layer formed in common in the entire light emitting area EA. A capping layer (not shown) may be disposed on the second light emitting electrode 173.

In the top emission structure, the second light emitting electrode 173 may include a transparent conductive material ("TCO") such as indium tin oxide (ITO) or indium zinc oxide ("IZO"), which can transmit light, or a semi-transmissive conductive material such as magnesium (Mg), silver (Ag) or an alloy of magnesium (Mg) and silver (Ag). When the second light emitting electrode 173 includes a semi-transmissive conductive material, light emission efficiency may be increased by microcavities.

An encapsulation layer TFE may be disposed on the second light emitting electrode 173. The encapsulation layer TFE may include at least one inorganic film to effectively prevent the penetration of oxygen or moisture into the light emitting element layer EML. Further, the encapsulation layer TFE may include at least one organic film to protect the light emitting element layer EML from foreign matter such as dust. For example, the encapsulation layer TFE includes a first inorganic film TFE1, an organic film TFE2, and a second inorganic film TFE3.

The first inorganic film TFE1 may be disposed on the second light emitting electrode 173, the organic film TFE2 may be disposed on the first inorganic film TFE1, and the second inorganic film TFE3 may be disposed on the organic film TFE2. Each of the first inorganic film TFE1 and the second inorganic film TFE3 may be a multi-layer film in which one or more inorganic layers of a silicon nitride layer, a silicon oxy nitride layer, a silicon oxide layer, a titanium oxide layer, and an aluminum oxide layer are alternately stacked. The organic film TFE2 may include or be formed of an acrylic resin, an epoxy resin, a phenolic resin, a polyamide resin, or a polyimide resin.

In an embodiment, in FIG. 11, the first gate insulating film 130 may be a first insulating film, the first interlayer insulating film 141 may be a second insulating film, the second interlayer insulating film 142 may be a third insulating film, the second gate insulating film 131 may be a fourth insulating film, and the third interlayer insulating film 150 may be a fifth insulating film.

Figure 12:
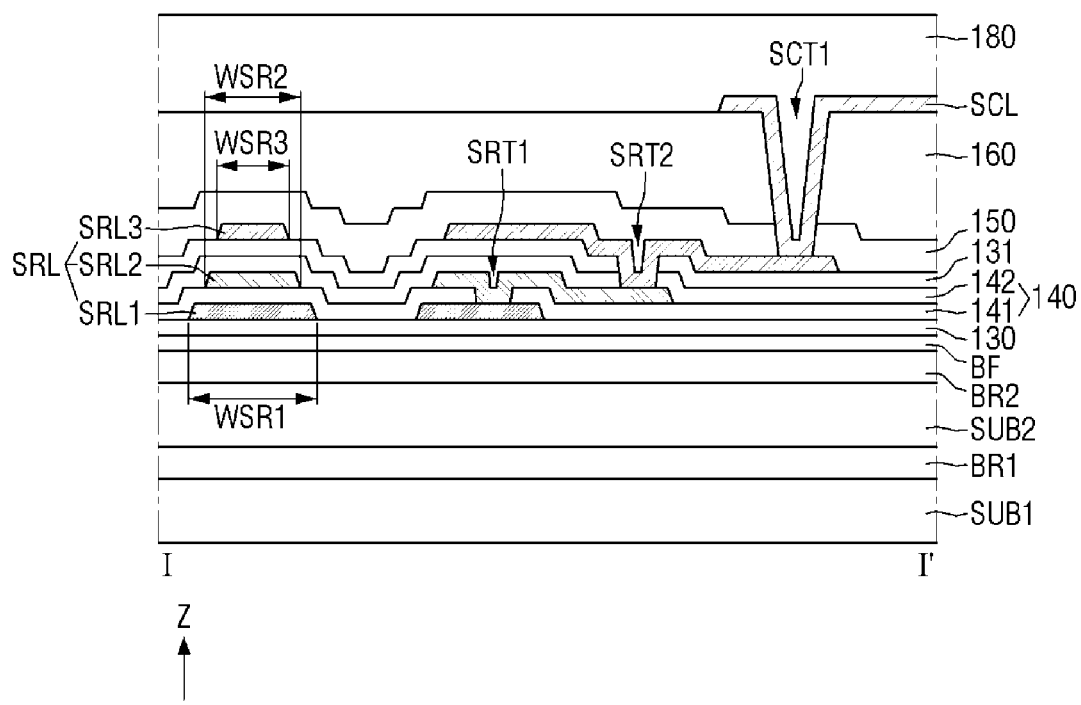
FIG. 12 is a cross-sectional view illustrating an embodiment of a display panel taken along line I-I' of FIG. 9.
Figure 13:
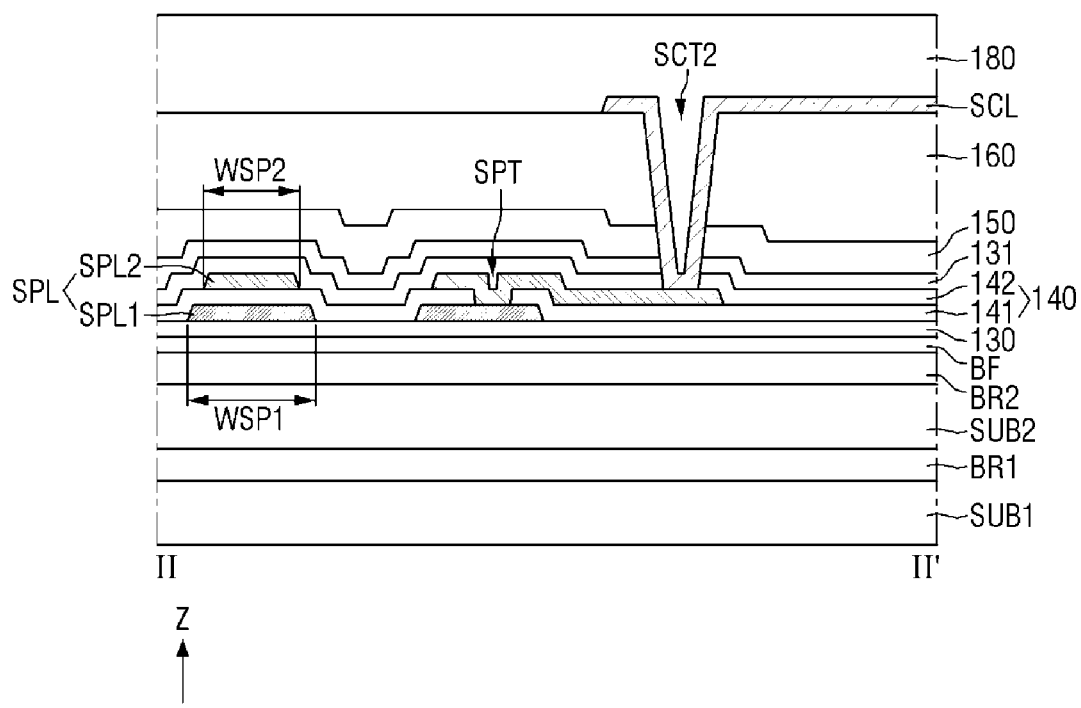
FIG. 13 is a cross-sectional view illustrating an embodiment of a display panel taken along line II-II' of FIG. 9.
Figure 14:
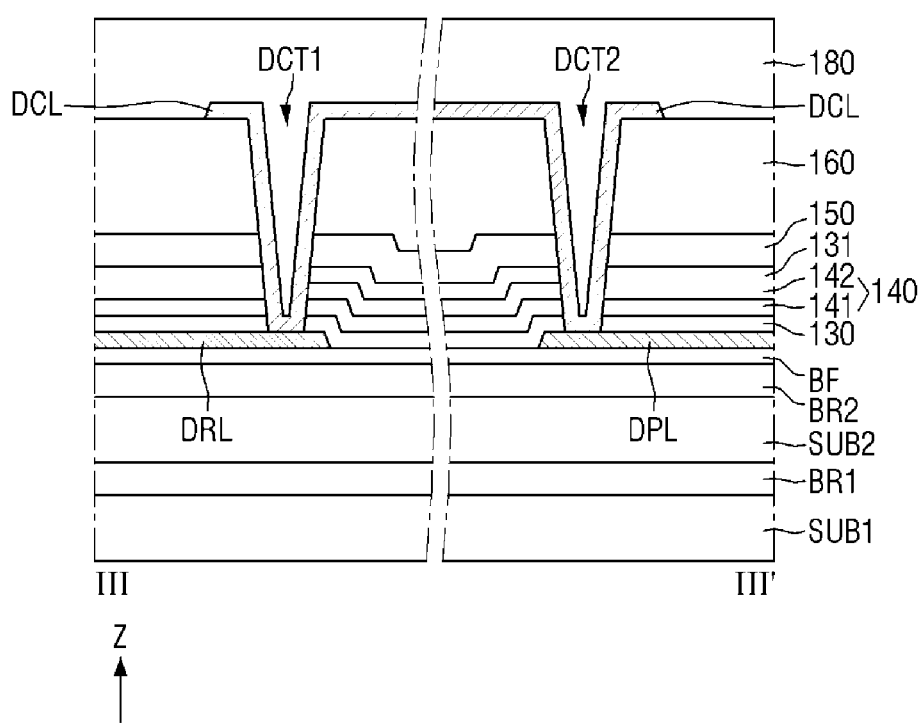
FIG. 14 is a cross-sectional view illustrating an embodiment of a display panel taken along line of FIG. 9.
Figure 15:
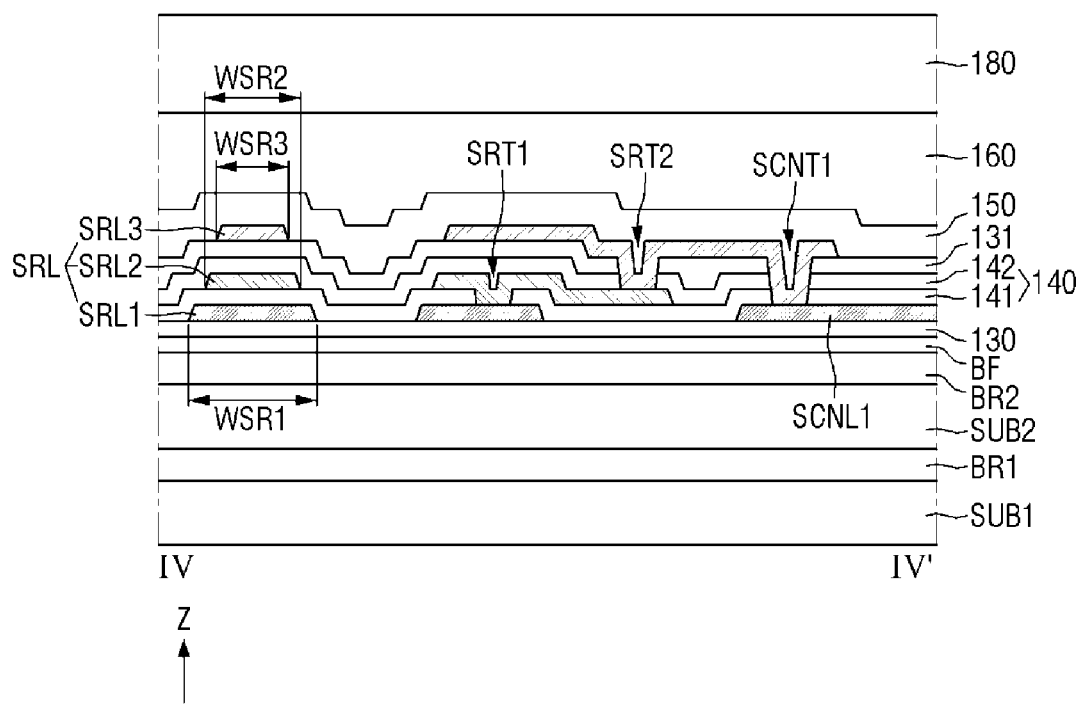
FIG. 15 is a cross-sectional view illustrating an embodiment of a display panel taken along line IV-IV' of FIG. 10.

FIG. 12 is a cross-sectional view illustrating an embodiment of a display panel taken along line I-I' of FIG. 9, FIG. 13 is a cross-sectional view illustrating an embodiment of a display panel taken along line II-II' of FIG. 9, FIG. 14 is a cross-sectional view illustrating an embodiment of a display panel taken along line of FIG. 9, and FIG. 15 is a cross-sectional view illustrating an embodiment of a display panel taken along line IV-IV' of FIG. 10.

Referring to FIGS. 12 to 15, the first sub-scan routing line SRL1, the first sub-scan pad line SPL1, the first scan control line SCNL1, and the data connection line DCL may be arranged on the first gate insulating film 130, and may be covered by the first interlayer insulating film 141. That is, the first sub-scan routing line SRL1, the first sub-scan pad line SPL1, the first scan control line SCNL1, and the data connection line DCL may be arranged in the same layer as the first gate electrode G1 of the first thin film transistor TFT1, and may include or be formed of the same material.

The second sub-scan routing line SRL2 and the second sub-scan pad line SPL2 may be arranged on the first interlayer insulating film 141, and may be covered by the second interlayer insulating film 142. That is, the second sub-scan routing line SRL2 and the second sub-scan pad line SPL2 may be arranged in the same layer as the second capacitor electrode CAE2, and may include or be formed of the same material.

The second sub-scan routing line SRL2 may be connected to the first sub-scan routing line SRL1 through the first scan routing contact hole SRT1 penetrating the first interlayer insulating film 141. The second sub-scan pad line SPL2 may be connected to the first sub-scan pad line SPL1 through the first scan pad contact hole SPT1 penetrating the first interlayer insulating film 141.

The third sub-scan routing line SRL3 and the third scan pad line SPL3 may be disposed on the second gate insulating film 131, and may be covered by the third interlayer insulating film 150. That is, the third sub-scan routing line SRL3 and the third scan pad line SPL3 may be disposed in the same layer as the second gate electrode G2 of the second thin film transistor TFT2, and may include or be formed of the same material.

The third sub-scan routing line SRL3 may be connected to the second sub-scan routing line SRL2 through the second scan routing contact hole SRT2 penetrating the second gate insulating film 131 and the second interlayer insulating film 142. Further, the third sub-scan routing line SRL3 may be connected to the first scan control line SCNL1 through the first scan control contact hole SCNT1 penetrating the second gate insulating film 131, the second interlayer insulating film 142, and the first interlayer insulating film 141. The third scan pad line SPL3 may be connected to the second sub-scan pad line SPL2 through the second scan pad contact hole SPT2 penetrating the second gate insulating film 131 and the second interlayer insulating film 142.

The line width WSR1 of the first sub-scan routing line SRL1 may be wider than the line width WSR2 of the second sub-scan routing line SRL2 at the same point in the plan view. The line width WSR2 of the second sub-scan routing line SRL2 may be wider than the line width WSR3 of the third sub-scan routing line SRL3 at the same point in the plan view. The line width WSP1 of the first sub-scan pad line SPL1 may be wider than the line width WSP2 of the second sub-scan pad line SPL2 at the same point in the plan view.

The scan connection line SCL and the data connection line DCL may be disposed on the first organic film 160, and may be covered by the second organic film 180. That is, the scan connection line SCL and the data connection line DCL may be disposed in the same layer as the second anode connection electrode ANDE2 and may include or be formed of the same material.

The scan connection line SCL may be connected to the third sub-scan routing line SRL3 through the first scan connection contact hole SCT1 penetrating the first organic film 160 and the third interlayer insulating film 150. Further, the scan connection line SCL may be connected to the third sub-scan pad line SPL3 through the second scan connection contact hole SCT2 penetrating the first organic film 160 and the third interlayer insulating film 150.

The data connection line DCL may be connected to the data routing line DRL through the first data connection contact hole DCT1 penetrating the first organic film 160, the third interlayer insulating film 150, the second gate insulating film 131, the second interlayer insulating film 142, and the first interlayer insulating film 141. Further, the data connection line DCL may be connected to the data pad line DPL through the second data connection contact hole DCT2 penetrating the first organic film 160, the third interlayer insulating film 150, the second gate insulating film 131, the second interlayer insulating film 142, and the first interlayer insulating film 141.

In an embodiment, the scan connection line SCL and the data connection line DCL may be disposed on the third interlayer insulating film 150, and may be covered by the first organic film 160. In this case, the scan connection line SCL and the data connection line DCL may be disposed in the same layer as the first anode connection electrode ANDE1, and may include or be formed of the same material.

Since the first sub-light emission routing line ERL1, the second sub-light emission routing line ERL2, and the third sub-light emission routing line ERL3 are substantially the same as the first sub-scan routing line SRL1, the second sub-scan routing line SRL2, and the third sub-scan routing line SRL3 described with reference to FIGS. 12 to 15, respectively, detailed descriptions thereof are omitted. Further, since the first sub-light emission pad line EPL1 and the second sub-light emission pad line EPL2 are substantially the same as the first sub-scan pad line SPL1 and the second sub-scan pad line SPL2 described with reference to FIGS. 12 to 15, respectively, detailed descriptions thereof are omitted. Moreover, since the light emission connection line ECL is substantially the same as the scan connection line SCL described with reference to FIGS. 12 to 15, a detailed description thereof is omitted.

In an embodiment, the second scan control line SCNL2 adjacent to the first scan control line SCNL1 may also be disposed on the first interlayer insulating film 141, and may be covered by the second interlayer insulating film 142. The first scan control lines SCNL1 and the second scan control lines SCNL2 may be alternately arranged on the first gate insulating film 130 and on the first interlayer insulating film 141.

The data routing line DRL and data pad line DPL of one data fan-out line DFL may be disposed on a different layer from the data routing line DRL and data pad line DPL of the data fan-out line DFL adjacent to the one data fan-out line DFL. For example, the data routing line DRL and data pad line DPL of one data fan-out line DFL may be disposed on the first gate insulating film 130, whereas the data routing line DRL and data pad line DPL of the data fan-out line DFL adjacent to the one data fan-out line DFL may be disposed on the first interlayer insulating film 141. The data routing lines DRL and data pad lines DPL of the data fan-out lines DFL may be alternately arranged on the first gate insulating film 130 and on the first interlayer insulating film 141.

Figure 16:
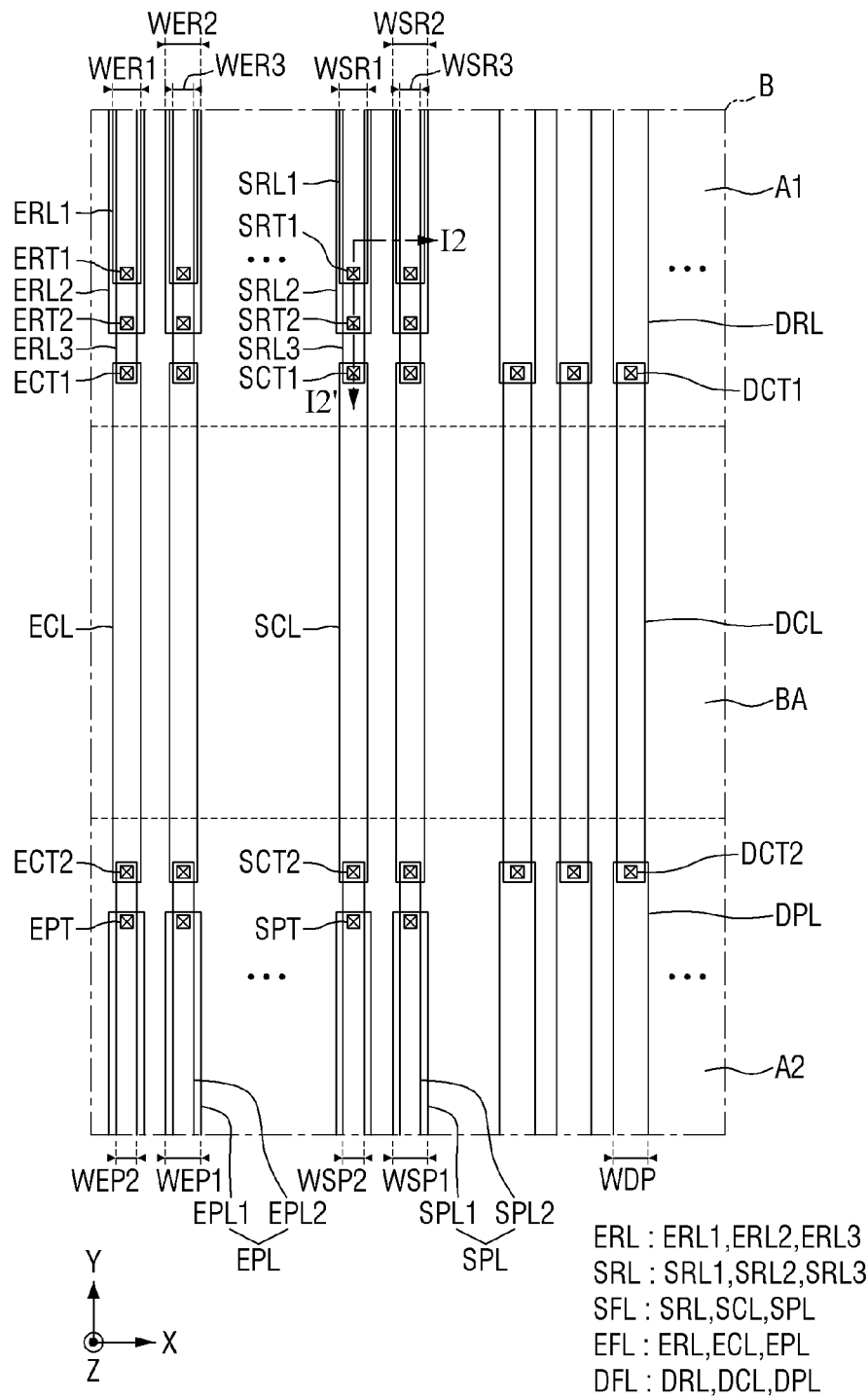
FIG. 16 is a layout view specifically illustrating another embodiment of the area B in FIG. 5.
Figure 17:
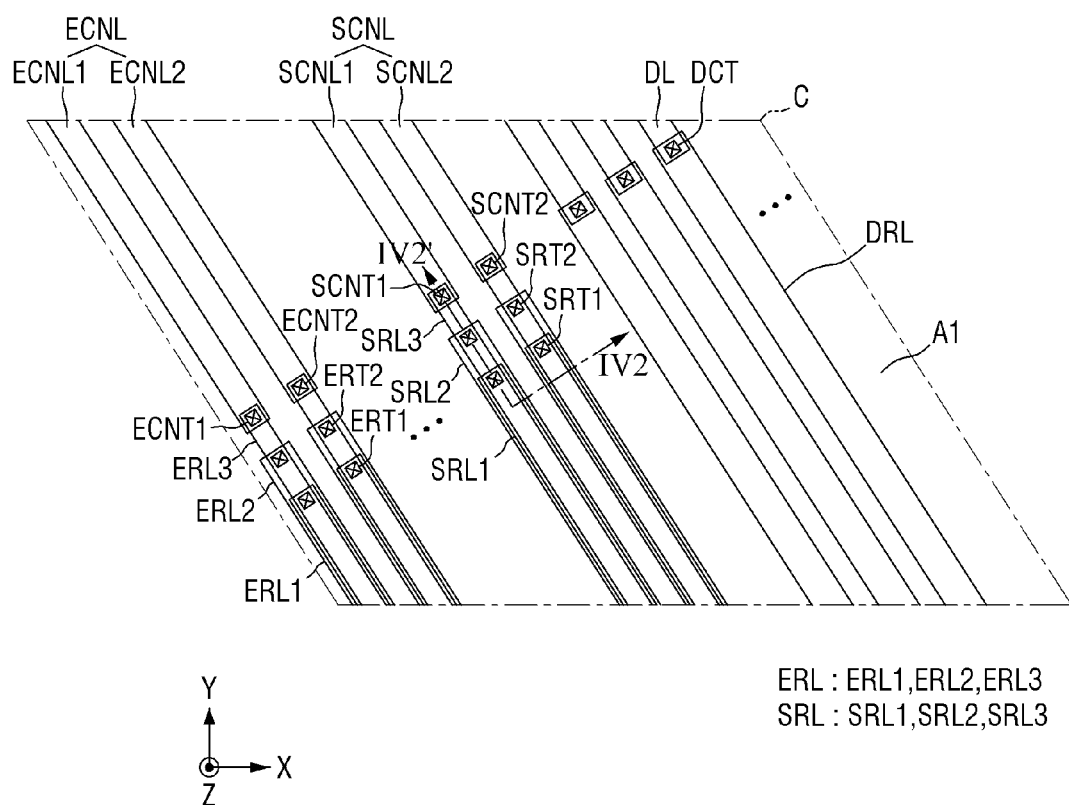
FIG. 17 is a layout view specifically illustrating another embodiment of the area C in FIG. 5.
Figure 18:
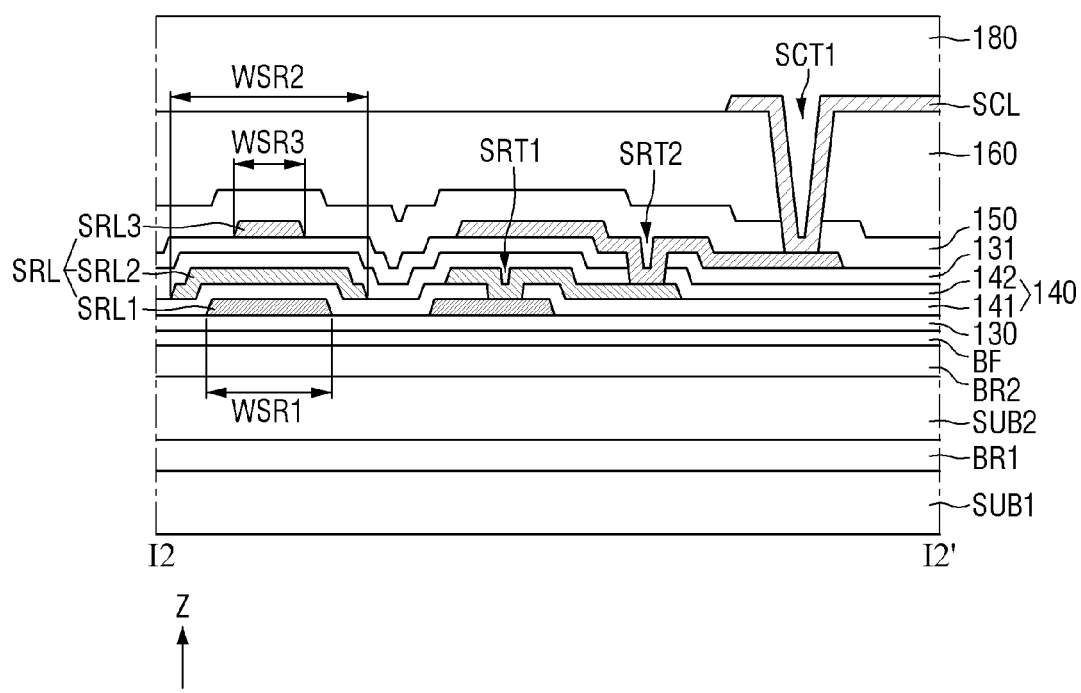
FIG. 18 is a cross-sectional view illustrating another embodiment of a display panel taken along line I2-I2' of FIG. 16.
Figure 19:
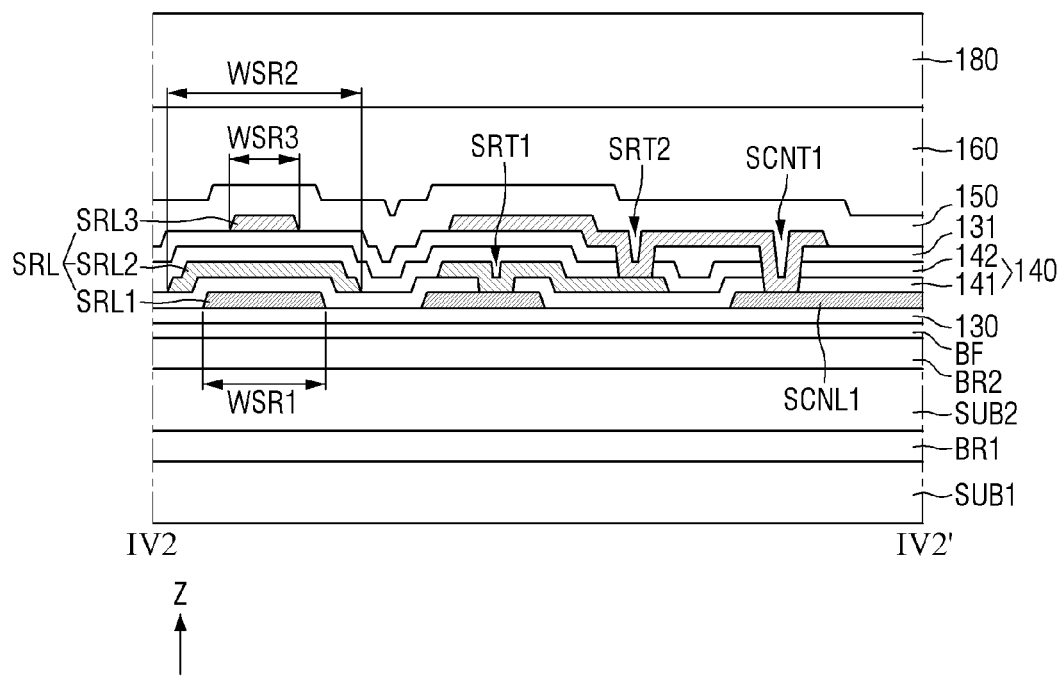
FIG. 19 is a cross-sectional view illustrating another embodiment of a display panel taken along line IV2-IV2' of FIG. 17.

FIG. 16 is a layout view specifically illustrating another embodiment of the area B in FIG. 5, FIG. 17 is a layout view specifically illustrating another embodiment of the area C in FIG. 5, FIG. 18 is a cross-sectional view illustrating another embodiment of a display panel taken along line I2-I2' of FIG. 16, and FIG. 19 is a cross-sectional view illustrating another embodiment of a display panel taken along line IV2-IV2' of FIG. 17.

The embodiment of FIGS. 16 to 19 is different from the embodiment of FIGS. 9, 10, 12, and 15 in that the line width WSR2 of the second sub-scan routing line SRL2 is greater than the line width WSR1 of the first sub-scan routing line SRL1, and the line width WER2 of the second sub-light emission routing line ERL2 is greater than the line width WER1 of the first sub-light emission routing line ERL1 in the first direction (X-axis direction). In FIGS. 16 to 19, differences from the embodiment of FIGS. 9, 10, 12, and 15 will be mainly described.

Referring to FIGS. 16 to 19, the line width WSR2 of the second sub-scan routing line SRL2 may be wider than the line width WSR1 of the first sub-scan routing line SRL1 at the same point in the plan view. The line width WSR1 of the first sub-scan routing line SRL1 may be wider than the line width WSR3 of the third sub-scan routing line SRL3 at the same point in the plan view. In this case, the second interlayer insulating film 142 has a stepped step.

When the residual film of the third sub-scan routing line SRL3 remains on the second interlayer insulating film 142 during the manufacturing process, the distance between the third sub-scan routing lines SRL3 adjacent to each other may be decreased. Thus, the third sub-scan routing lines SRL3 adjacent to each other may be shorted by the residual film.

When the line width WSR2 of the second sub-scan routing line SRL2 is greater than the line width WSR1 of the first sub-scan routing line SRL1 at the same point in the plan view, the second interlayer insulating film 142 may have a stepped step. Thus, even when the residual film of the third sub-scan routing line SRL3 remains on the second interlayer insulating film 142 during the manufacturing process, there is a high possibility that the third sub-scan routing line SRL3 and the residual film are cut off due to the step of the second interlayer insulating film 142. Accordingly, it is possible to effectively prevent or reduce the short of the third sub-scan routing lines SRL3 adjacent to each other by the residual film.

Further, the line width WER2 of the second sub-light emission routing line ERL2 may be wider than the line width WER1 of the first sub-light emission routing line ERL1 at the same point in the plan view. The line width WER1 of the first sub-light emission routing line ERL1 may be wider than the line width WER3 of the third sub-light emission routing line ERL3 at the same point in the plan view. In this case, the second interlayer insulating film 142 has a stepped step. Therefore, even when the residual film of the third sub-light emission routing line ERL3 remains on the second interlayer insulating film 142 during the manufacturing process, there is a high possibility that the third sub-light emission routing line ERL3 and the residual film are cut off due to the step of the second interlayer insulating film 142. Accordingly, it is possible to effectively prevent or reduce the short of the third sub-light emission routing line ERL3 adjacent to each other by the residual film.

Moreover, the cross section of the display panel taken along line II-II' in FIG. 16 is substantially the same as that in FIG. 13, and the cross section of the display panel taken along line in FIG. 16 is substantially the same as that in FIG. 14. Therefore, illustration and description thereof are omitted.

Figure 20:
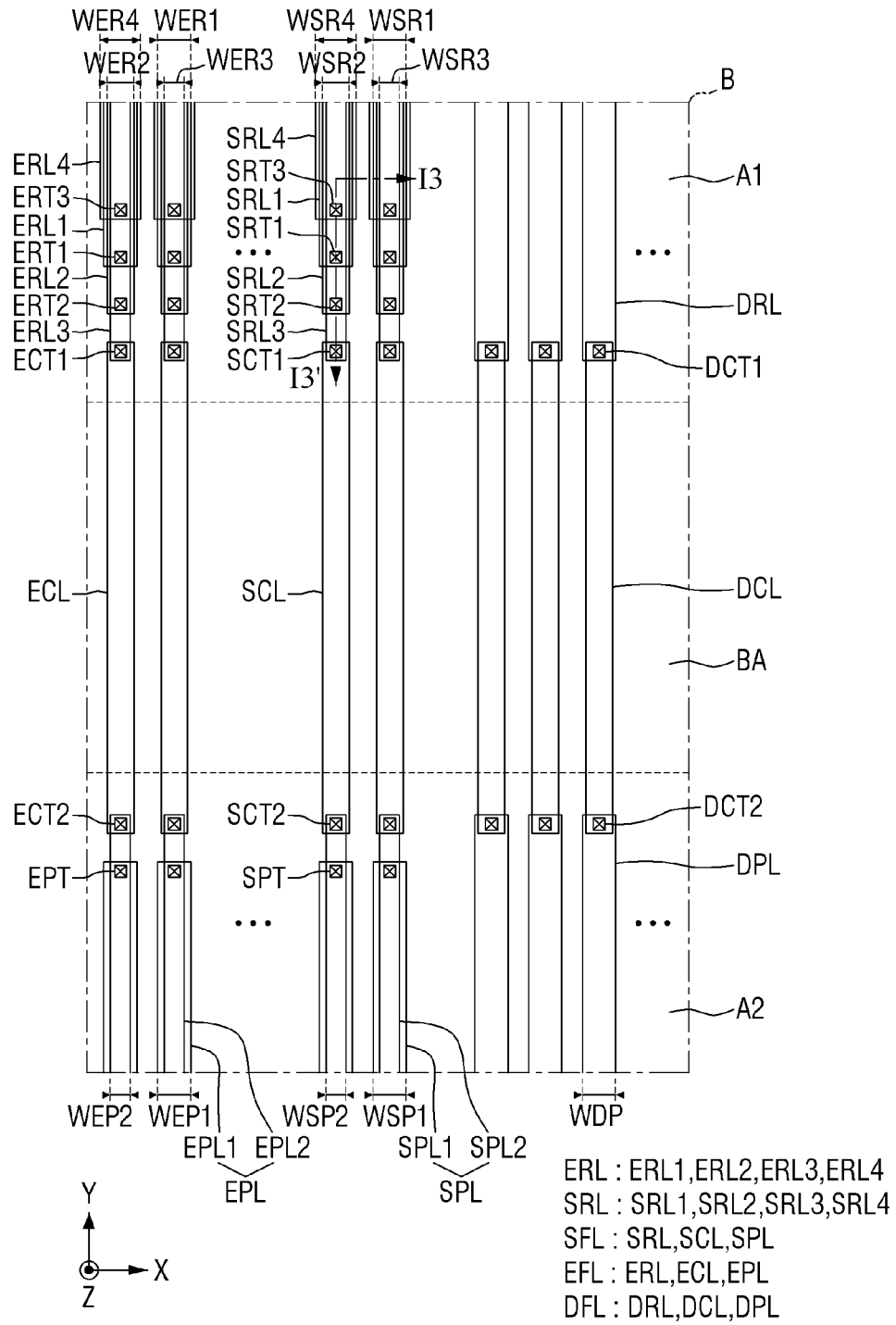
FIG. 20 is a layout view specifically illustrating still another embodiment of the area B in FIG. 5.
Figure 21:
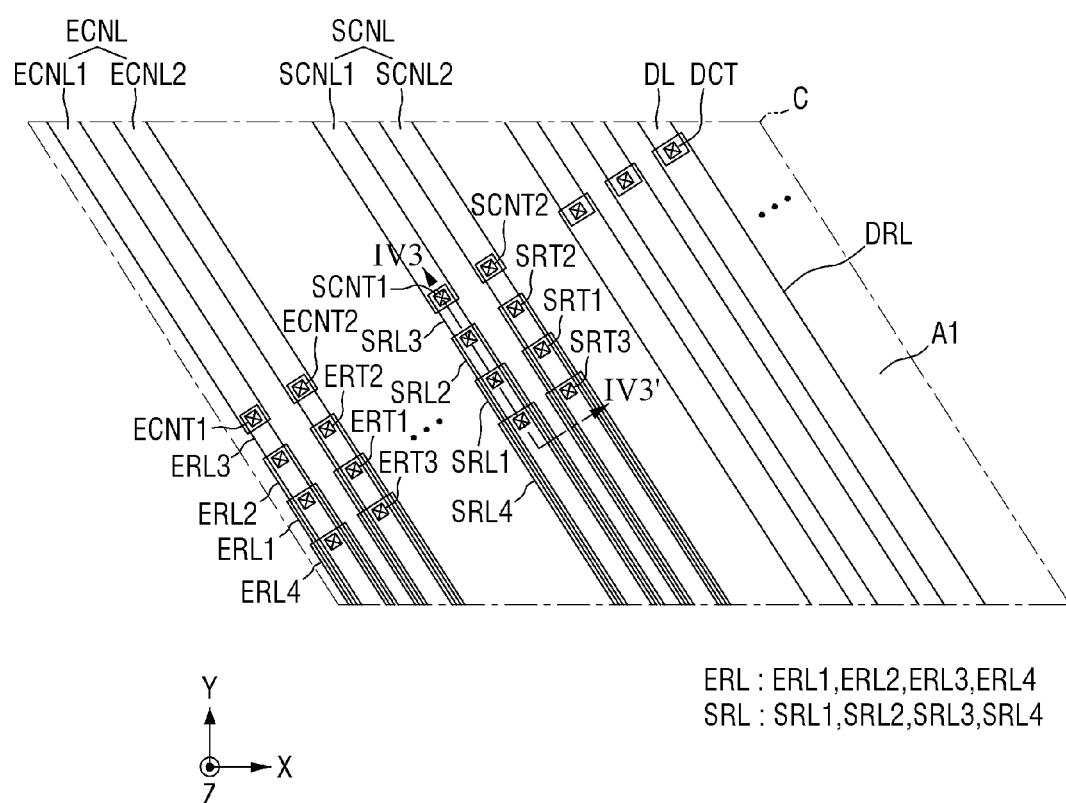
FIG. 21 is a layout view specifically illustrating still another embodiment of the area C in FIG. 5.
Figure 22:
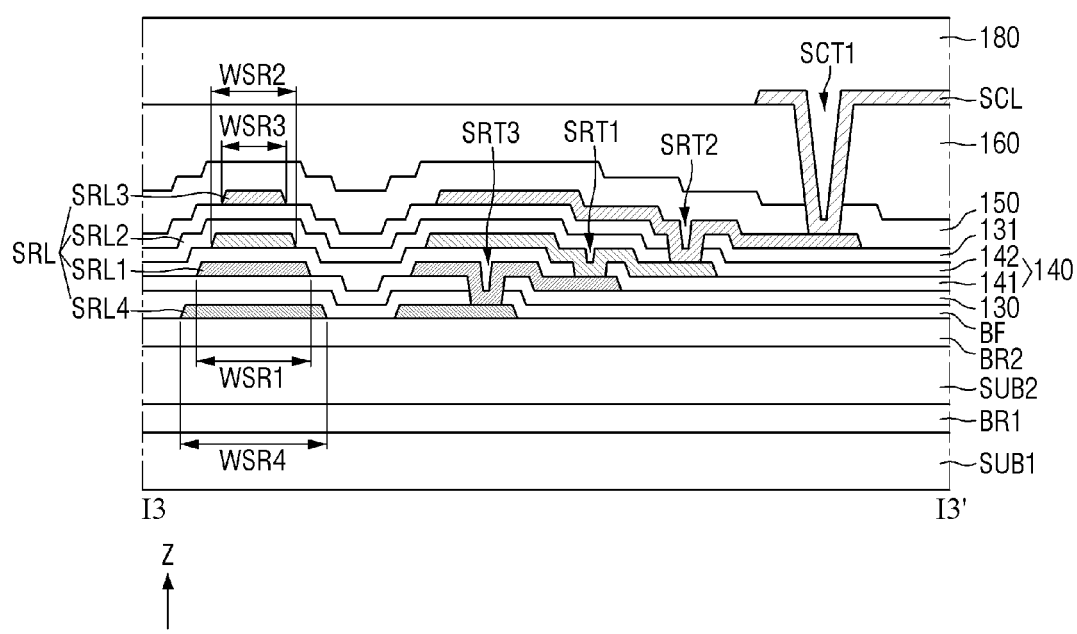
FIG. 22 is a cross-sectional view illustrating another embodiment of a display panel taken along line I3-I3' of FIG. 20.
Figure 23:
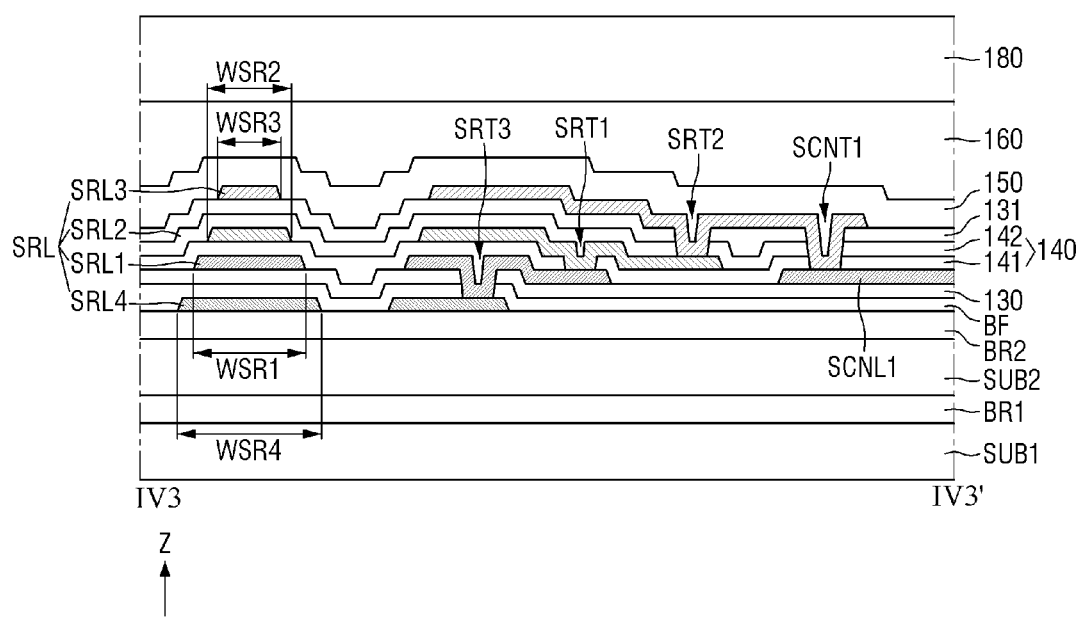
FIG. 23 is a cross-sectional view illustrating another embodiment of a display panel taken along line IV3-IV3' of FIG. 21.

FIG. 20 is a layout view specifically illustrating still another embodiment of the area B in FIG. 5, FIG. 21 is a layout view specifically illustrating still another embodiment of the area C in FIG. 5, FIG. 22 is a cross-sectional view illustrating another embodiment of a display panel taken along line I3-I3' of FIG. 20, and FIG. 23 is a cross-sectional view illustrating another embodiment of a display panel taken along line IV3-IV3' of FIG. 21.

The embodiment of FIGS. 20 to 23 is different from the embodiment of FIGS. 9, 10, 12, and 15 in that the scan routing line SRL includes four sub-scan routing lines SRL1 to SRL4, and the light emission routing line ERL includes four sub-light emission routing lines ERL1 to ERL4. In FIGS. 20 to 23, differences from the embodiment of FIGS. 9, 10, 12, and 15 will be mainly described.

Referring to FIGS. 20 to 23, the scan routing line SRL may include a first sub-scan routing line SRL1, a second sub-scan routing line SRL2, a third sub-scan routing line SRL3, and a fourth sub-scan routing line SRL4.

The first sub-scan routing line SRL1, the second sub-scan routing line SRL2, the third sub-scan routing line SRL3, and the fourth sub-scan routing line SRL4 may overlap each other in the third direction (Z-axis direction). The first sub-scan routing line SRL1, the second sub-scan routing line SRL2, the third sub-scan routing line SRL3, and the fourth sub-scan routing line SRL4 may be electrically connected to each other.

The fourth sub-scan routing line SRL4 may be disposed under the first sub-scan routing line SRL1. The fourth sub-scan routing line SRL4 may be disposed on the second barrier film BR2, and may be covered by the buffer film BF. The fourth sub-scan routing line SRL4 may be connected to the first sub-scan routing line SRL1 through the third scan routing contact hole SRT3 penetrating the buffer film BF. The line width WSR4 of the fourth sub-scan routing line SRL4 may be wider than the line width WSR1 of the first sub-scan routing line SRL1 at the same point in the plan view.

Since the first sub-scan routing line SRL1, the second sub-scan routing line SRL2, and the third sub-scan routing line SRL3 are substantially the same as those described with reference to FIGS. 9, 10, 12, and 15, descriptions thereof are omitted.

The light emission routing line ERL may include a first sub-light emission routing line ERL1, a second sub-light emission routing line ERL2, a third sub-light emission routing line ERL3, and a fourth sub-light emission routing line ERL4.

The first sub-light emission routing line ERL1, the second sub-light emission routing line ERL2, the third sub-light emission routing line ERL3, and the fourth sub-light emission routing line ERL4 may overlap each other in the third direction (Z-axis direction). The first sub-light emission routing line ERL1, the second sub-light emission routing line ERL2, the third sub-light emission routing line ERL3, and the fourth sub-light emission routing line ERL4 may be electrically connected to each other.

The fourth sub-light emission routing line ERL4 may be disposed under the first sub-light emission routing line ERL1. The fourth sub-light emission routing line ERL4 may be disposed on the second barrier film BR2, and may be covered by the buffer film BF. The fourth sub-light emission routing line ERL4 may be connected to the first sub-light emission routing line ERL1 through the third light emission routing contact hole ERT3 penetrating the buffer film BF. The line width WER4 of the fourth sub-light emission routing line ERL4 may be wider than the line width WER1 of the first sub-light emission routing line ERL1 at the same point in the plan view.

Since the first sub-light emission routing line ERL1, the second sub-light emission routing line ERL2, and the third sub-light emission routing line ERL3 are substantially the same as those described with reference to FIGS. 9, 10, 12, and 15, descriptions thereof are omitted.

In an embodiment, the cross section of the display panel taken along line II-II' in FIG. 20 is substantially the same as that in FIG. 13, and the cross section of the display panel taken along line in FIG. 20 is substantially the same as that in FIG. 14. Therefore, illustration and description thereof are omitted.

Figure 24:
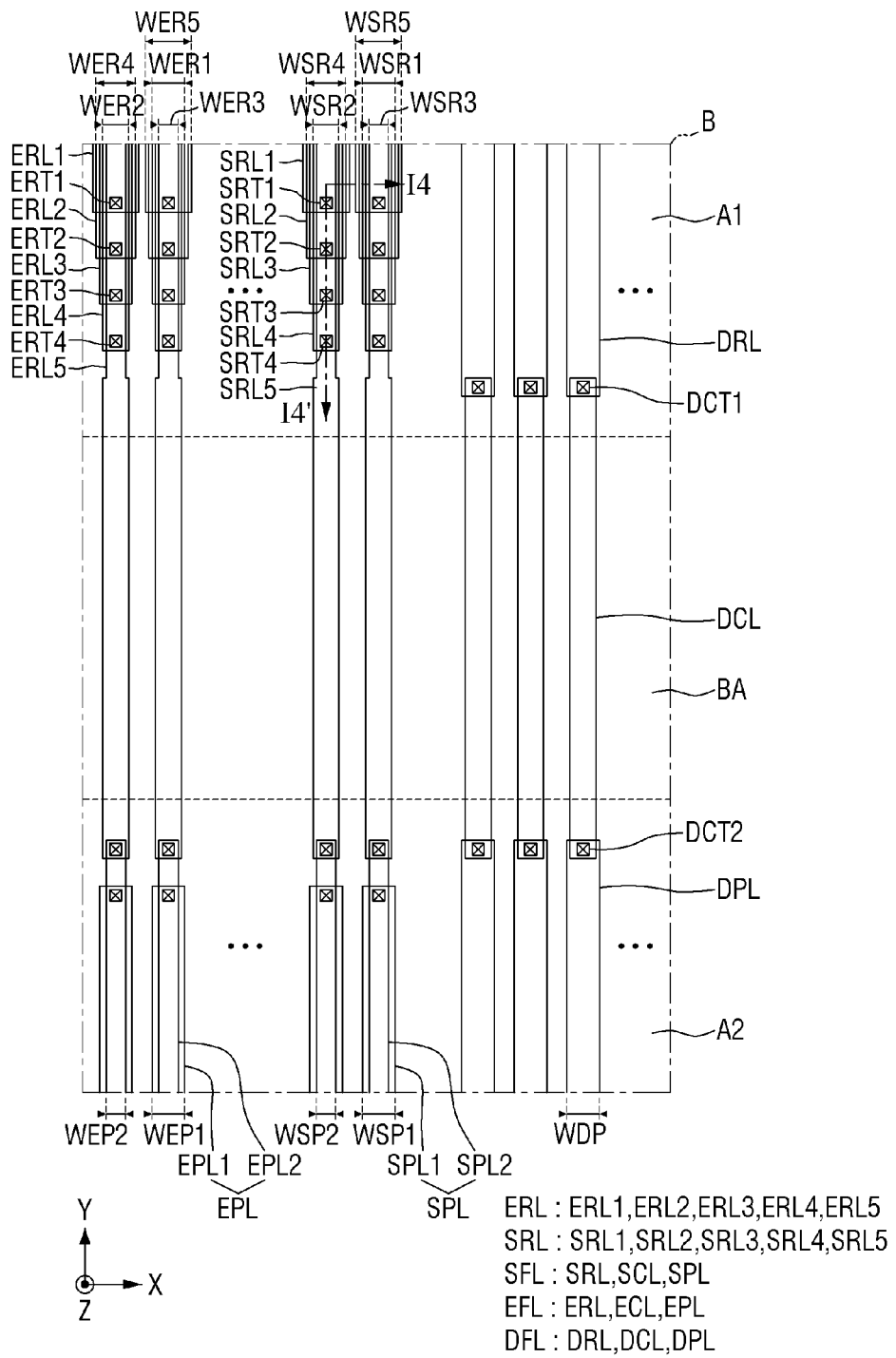
FIG. 24 is a layout view specifically illustrating yet another embodiment of the area B in FIG. 5.
Figure 25:
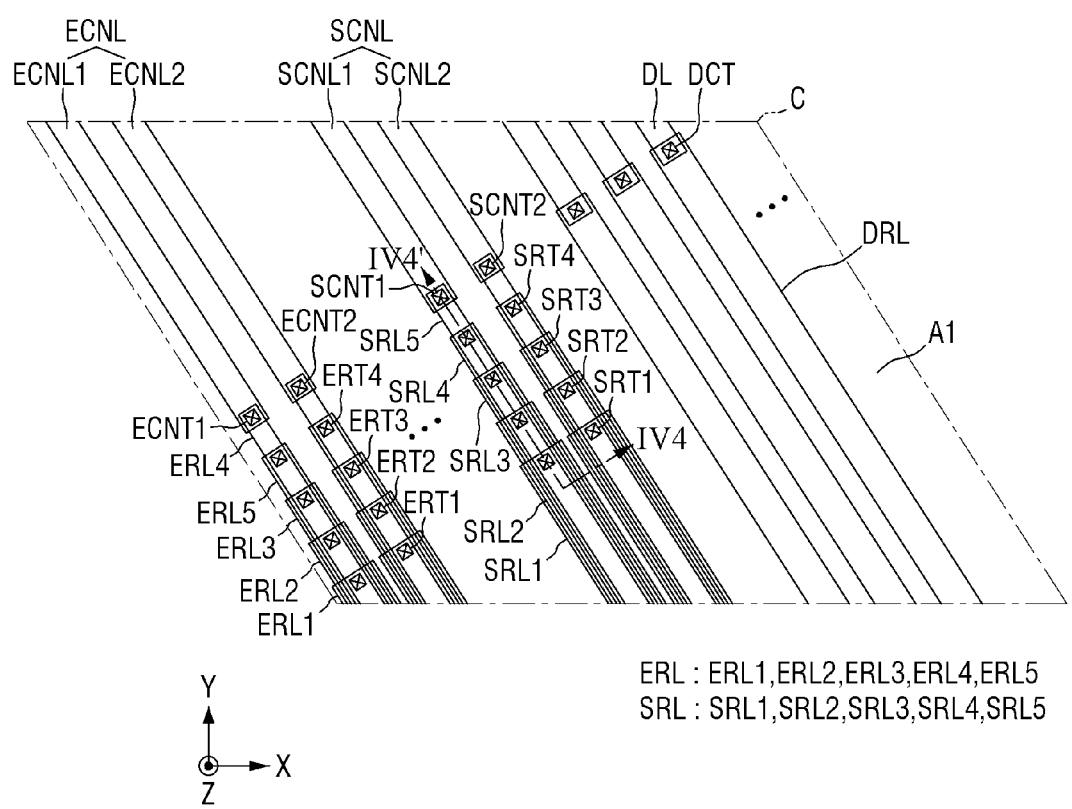
FIG. 25 is a layout view specifically illustrating yet another embodiment of the area C in FIG. 5.
Figure 26:
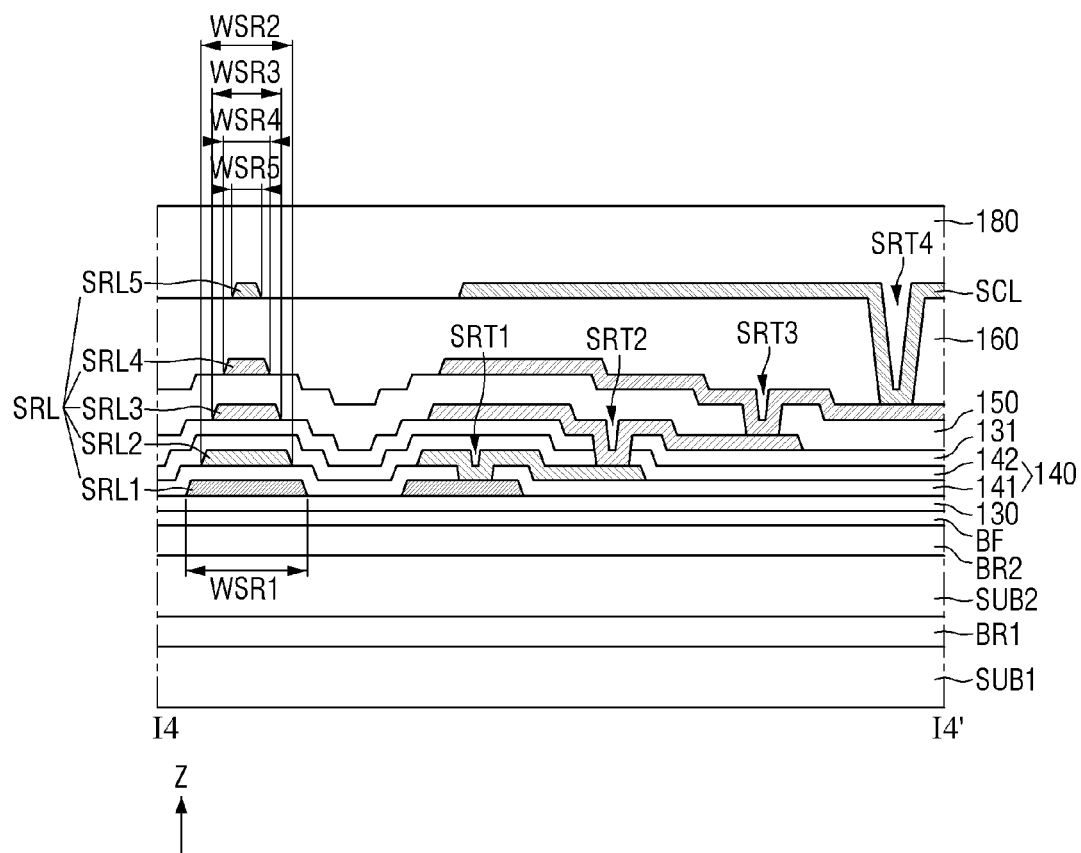
FIG. 26 is a cross-sectional view illustrating another embodiment of a display panel taken along line I4-I4' of FIG. 24.
Figure 27:
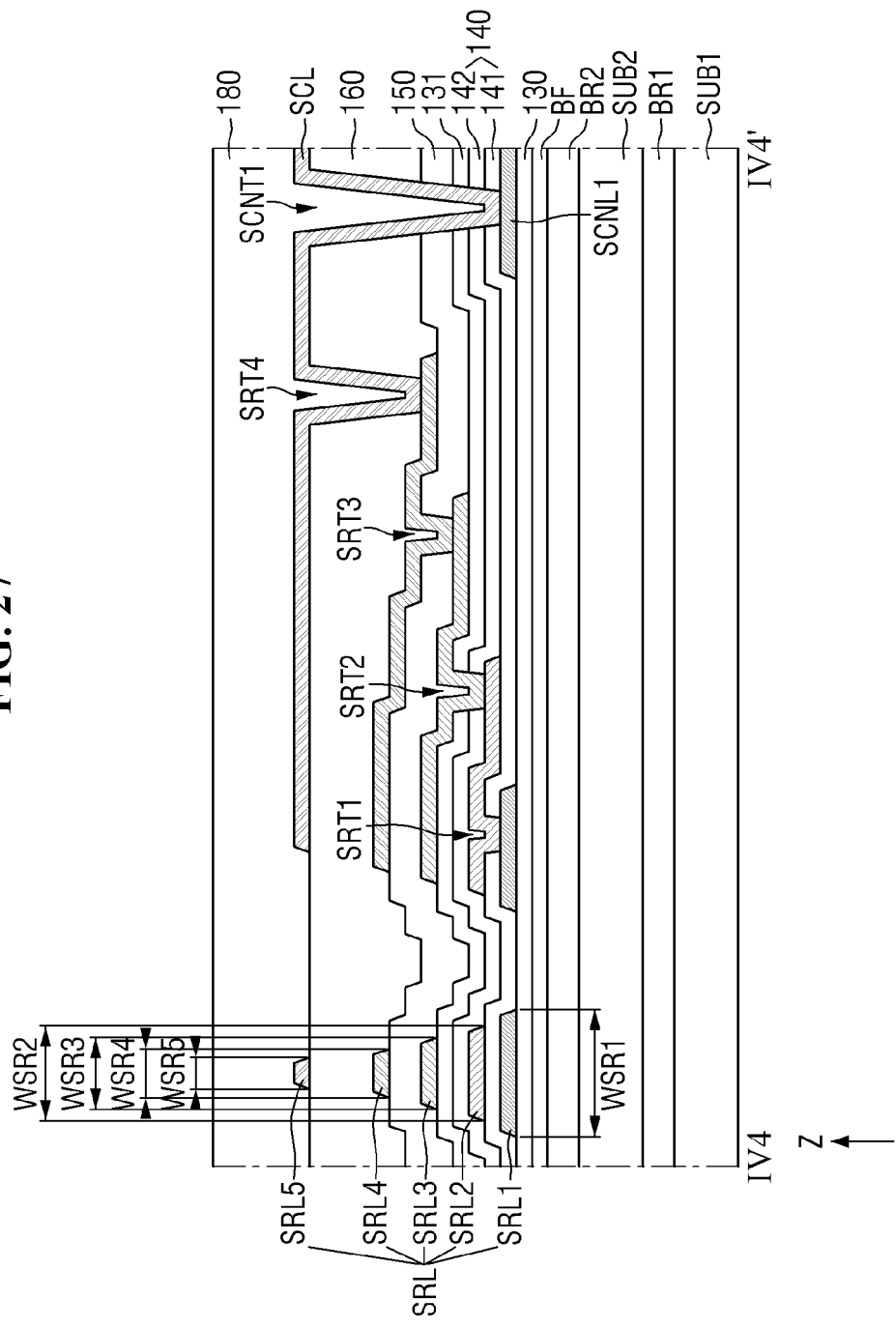
FIG. 27 is a cross-sectional view illustrating another embodiment of a display panel taken along line IV4-IV4' of FIG. 25.

FIG. 24 is a layout view specifically illustrating yet another embodiment of the area B in FIG. 5, FIG. 25 is a layout view specifically illustrating yet another embodiment of the area C in FIG. 5, FIG. 26 is a cross-sectional view illustrating another embodiment of a display panel taken along line I4-I4' of FIG. 24, and FIG. 27 is a cross-sectional view illustrating another embodiment of a display panel taken along line IV4-IV4' of FIG. 25.

The embodiment of FIGS. 24 to 27 is different from the embodiment of FIGS. 9, 10, 12, and 15 in that the scan routing line SRL includes five sub-scan routing lines SRL1 to SRL5, and the light emission routing line ERL includes five sub-light emission routing lines ERL1 to ERL5. In FIGS. 24 to 27, differences from the embodiment of FIGS. 9, 10, 12, and 15 will be mainly described.

Referring to FIGS. 24 to 27, the scan routing line SRL may include a first sub-scan routing line SRL1, a second sub-scan routing line SRL2, a third sub-scan routing line SRL3, a fourth sub-scan routing line SRL4, and a fifth sub-scan routing line SRL5.

The first sub-scan routing line SRL1, the second sub-scan routing line SRL2, the third sub-scan routing line SRL3, the fourth sub-scan routing line SRL4, and the fifth sub-scan routing line SRL5 may overlap each other in the third direction (Z-axis direction). The first sub-scan routing line SRL1, the second sub-scan routing line SRL2, the third sub-scan routing line SRL3, the fourth sub-scan routing line SRL4, and the fifth sub-scan routing line SRL5 may be electrically connected to each other.

The fourth sub-scan routing line SRL4 may be disposed on the third sub-scan routing line SRL3. The fourth sub-scan routing line SRL4 may be disposed on the third interlayer insulating film 150, and may be covered by the first organic film 160. That is, the fourth sub-scan routing line SRL4 may be disposed in the same layer as the first anode connection electrode ANDE1, and may include or be formed of the same material. The fourth sub-scan routing line SRL4 may be connected to the third sub-scan routing line SRL3 through the third scan routing contact hole SRT3 penetrating the third interlayer insulating film 150.

The fifth sub-scan routing line SRL5 may be disposed on the fourth sub-scan routing line SRL4. The fifth sub-scan routing line SRL5 may be disposed on the first organic film 160, and may be covered by the second organic film 180. That is, the fifth sub-scan routing line SRL5 may be disposed in the same layer as the second anode connection electrode ANDE2, and may include or be formed of the same material. The fifth sub-scan routing line SRL5 may be connected to the fourth sub-scan routing line SRL4 through the fourth scan routing contact hole SRT4 penetrating the first organic film 160. In this case, the fifth sub-scan routing line SRL5 may be disposed in the same layer as the scan connection line SCL, and may include or be formed of the same material. Therefore, the fifth sub-scan routing line SRL5 may be connected to the scan connection line SCL without a separate contact hole.

The line width WSR3 of the third sub-scan routing line SRL3 may be wider than the line width WSR4 of the fourth sub-scan routing line SRL4 at the same point in the plan view. The line width WSR4 of the fourth sub-scan routing line SRL4 may be wider than the line width WSR5 of the fifth sub-scan routing line SRL5 at the same point in the plan view.

Since the first sub-scan routing line SRL1, the second sub-scan routing line SRL2, and the third sub-scan routing line SRL3 are substantially the same as those described with reference to FIGS. 9, 10, 12, and 15, descriptions thereof are omitted.

The light emission routing line ERL may include a first sub-light emission routing line ERL1, a second sub-light emission routing line ERL2, a third sub-light emission routing line ERL3, a fourth sub-light emission routing line ERL4, and a fifth sub-light emission routing line ERL5.

The first sub-light emission routing line ERL1, the second sub-light emission routing line ERL2, the third sub-light emission routing line ERL3, the fourth sub-light emission routing line ERL4, and the fifth sub-light emission routing line ERL5 may overlap each other in the third direction (Z-axis direction). The first sub-light emission routing line ERL1, the second sub-light emission routing line ERL2, the third sub-light emission routing line ERL3, the fourth sub-light emission routing line ERL4, and the fifth sub-light emission routing line ERL5 may be electrically connected to each other.

The fourth sub-light emission routing line ERL4 may be disposed on the third sub-light emission routing line ERL3. The fourth sub-light emission routing line ERL4 may be disposed on the third interlayer insulating film 150, and may be covered by the first organic film 160. That is, the fourth sub-light emission routing line ERL4 may be disposed in the same layer as the first anode connection electrode ANDE1, and may include or be formed of the same material. The fourth sub-light emission routing line ERL4 may be connected to the third sub-light emission routing line ERL3 through the third light emission routing contact hole ERT3 penetrating the third interlayer insulating film 150.

The fifth sub-light emission routing line ERL5 may be disposed on the fourth sub-light emission routing line ERL4. The fifth sub-light emission routing line ERL5 may be disposed on the first organic film 160, and may be covered by the second organic film 180. That is, the fifth sub-light emission routing line ERL5 may be disposed in the same layer as the second anode connection electrode ANDE2, and may include or be formed of the same material. The fifth sub-light emission routing line ERL5 may be connected to the fourth sub-light emission routing line ERL4 through the fourth light emission routing contact hole ERT4 penetrating the first organic film 160. In this case, the fifth sub-light emission routing line ERL5 may be disposed in the same layer as the light emission connection line ECL, and may include or be formed of the same material. Therefore, the fifth sub-light emission routing line ERL5 may be connected to the light emission connection line ECL without a separate contact hole.

The line width WER3 of the third sub-light emission routing line ERL3 may be wider than the line width WER4 of the fourth sub-light emission routing line ERL4 at the same point in the plan view. The line width WER4 of the fourth sub-light emission routing line ERL4 may be wider than the line width WER5 of the fifth sub-light emission routing line ERL5 at the same point in the plan view.

Since the first sub-light emission routing line ERL1, the second sub-light emission routing line ERL2, and the third sub-light emission routing line ERL3 are substantially the same as those described with reference to FIGS. 9, 10, 12, and 15, descriptions thereof are omitted.

In an embodiment, the arrangement of the first sub-scan routing line SRL1, the second sub-scan routing line SRL2, the third sub-scan routing line SRL3, the fourth sub-scan routing line SRL4, and the fifth sub-scan routing line, and the arrangement of the first sub-light emission routing line ERL1, the second sub-light emission routing line ERL2, the third sub-light emission routing line ERL3, the fourth sub-light emission routing line ERL4, and the fifth sub-light emission routing line ERL5 are not limited to those shown in FIGS. 24 to 27. The first sub-scan routing line SRL1 and the first sub-light emission routing line ERL1 may be arranged on the second barrier film BR2, the second sub-scan routing line SRL2 and the second sub-light emission routing line ERL2 may be arranged on the first gate insulating film 130, and the third sub-scan routing line SRL3 and the third sub-light emission routing line ERL3 may be arranged on the first interlayer insulating film 141. The fourth sub-scan routing line SRL4 and the fourth sub-light emission routing line ERL4 may be arranged on the second gate insulating film 131, and the fifth sub-scan routing line SRL5 and the fifth sub-light emission routing line ERL5 may be arranged on the third interlayer insulating film 150. In this case, the scan connection line SCL may be connected to the fifth sub-scan routing line SRL5 through a separate contact hole. Further, the light emission connection line ECL may be connected to the fifth sub-light emission routing line ERL5 through a separate contact hole.

Further, the cross section of the display panel taken along line II-II' in FIG. 24 is substantially the same as that in FIG. 13, and the cross section of the display panel taken along line III-III' in FIG. 24 is substantially the same as that in FIG. 14. Therefore, illustration and description thereof are omitted.

Figure 28:
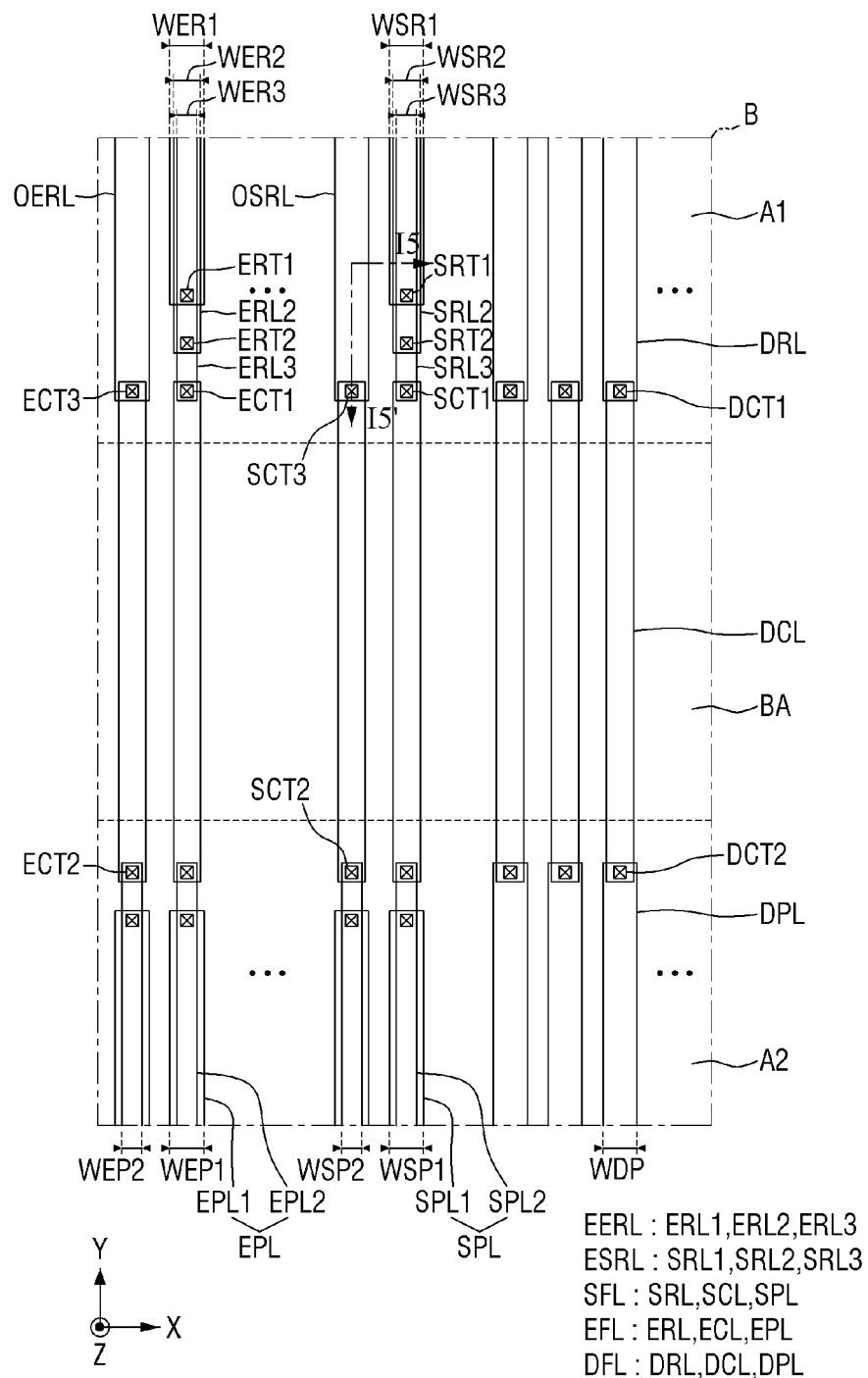
FIG. 28 is a layout view specifically illustrating another embodiment of the area B in FIG. 5.
Figure 29:
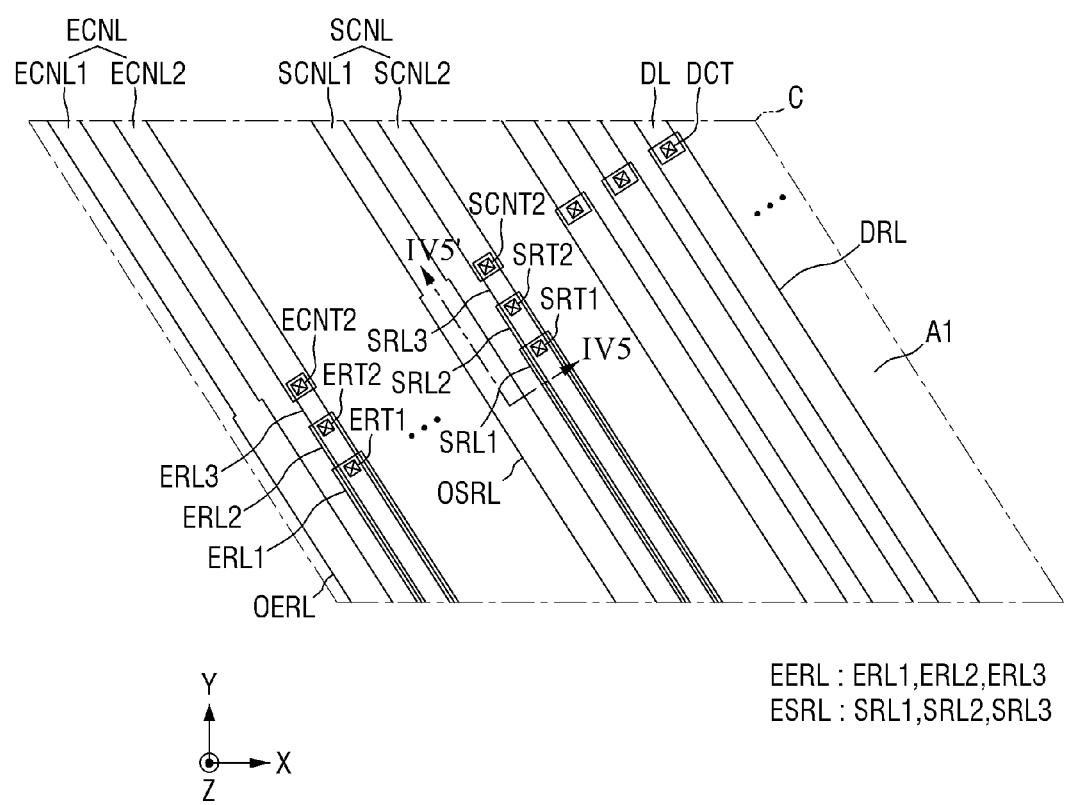
FIG. 29 is a layout view specifically illustrating another embodiment of the area C in FIG. 5.
Figure 30:
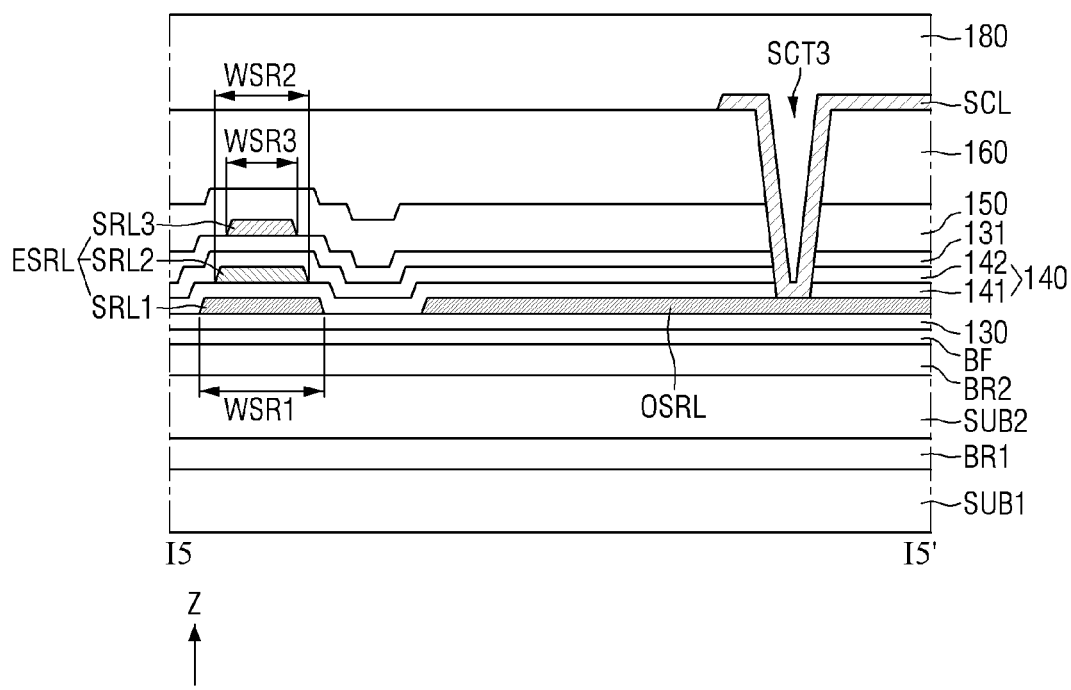
FIG. 30 is a cross-sectional view illustrating an embodiment of a display panel taken along line I5-I5' of FIG. 28.
Figure 31:
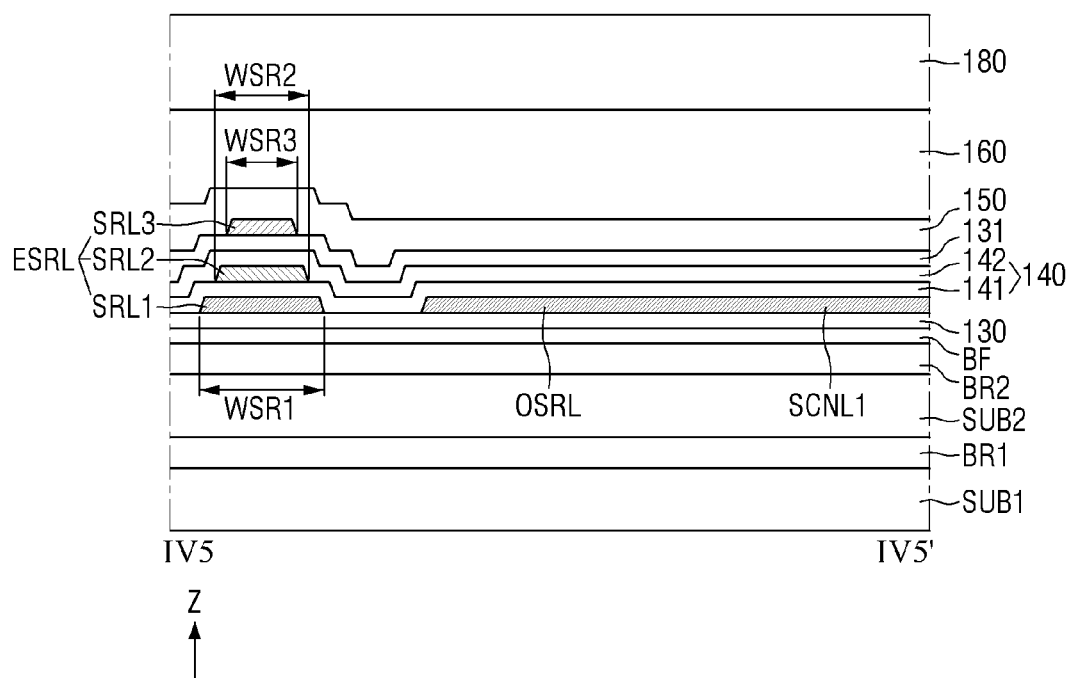
FIG. 31 is a cross-sectional view illustrating an embodiment of a display panel taken along line IV5-IV5' of FIG. 29.

FIG. 28 is a layout view specifically illustrating another embodiment of the area B in FIG. 5, FIG. 29 is a layout view specifically illustrating another embodiment of the area C in FIG. 5, FIG. 30 is a cross-sectional view illustrating an embodiment of a display panel taken along line I5-I5' of FIG. 28, and FIG. 31 is a cross-sectional view illustrating an embodiment of a display panel taken along line IV5-IV5' of FIG. 29.

The embodiment of FIGS. 28 to 31 is different from the embodiment of FIGS. 9, 10, 12, and 15 in that the odd scan routing line OSRL is a single layer, and the even scan routing line ESRL includes a plurality of sub-scan routing lines SRL1 to SRL3 arranged on a plurality of layers and in that the odd light emission routing line OERL is a single layer, and the even light emission routing line EERL includes a plurality of sub-light emission routing lines ERL1 to ERL3 arranged on a plurality of layers. In FIGS. 28 to 31, differences from the embodiment of FIGS. 9, 10, 12, and 15 will be mainly described.

Referring to FIGS. 28 to 31, the odd scan routing line OSRL may be disposed on the first gate insulating film 130. That is, the odd scan routing line OSRL may be disposed in the same layer as the first gate electrode G1 of the first thin film transistor TFT1, and may include or be formed of the same material. In this case, the scan connection line SCL may be connected to the odd scan routing line OSRL through the third scan connection contact hole SCT3 penetrating the first organic film 160, the third interlayer insulating film 150, the second gate insulating film 131, the second interlayer insulating film 142, and the first interlayer insulating film 141. Further, since the odd scan routing line OSRL is disposed in the same layer as the first scan control line SCNL1 and includes or is formed of the same material, the odd scan routing line OSRL may be connected to the first scan control line SCNL1 without a separate contact hole.

Alternatively, the odd scan routing line OSRL may also be disposed on the first interlayer insulating film 141. That is, the odd scan routing line OSRL may be disposed in the same layer as the second capacitor electrode CAE2, and may include or be formed of the same material. In this case, the scan connection line SCL may be connected to the odd scan routing line OSRL through the third scan connection contact hole SCT3 penetrating the first organic film 160, the third interlayer insulating film 150, the second gate insulating film 131, and the second interlayer insulating film 142. Further, the odd scan routing line OSRL and the first scan control line SCNL1 may be disposed in the same layer, and may include or be formed of the same material. Therefore, the odd scan routing line OSRL may be connected to the first scan control line SCNL1 without a separate contact hole.

Since the even scan routing line ESRL is substantially the same as the scan routing line SRL described with reference to FIGS. 9, 10, 12, and 15, a description thereof will be omitted.

The odd light emission routing line OERL may be disposed on the first gate insulating film 130. That is, the odd light emission routing line OERL may be disposed in the same layer as the first gate electrode G1 of the first thin film transistor TFT1, and may include or be formed of the same material. In this case, the light emission connection line ECL may be connected to the odd light emission routing line OERL through the third scan connection contact hole SCT3 penetrating the first organic film 160, the third interlayer insulating film 150, the second gate insulating film 131, the second interlayer insulating film 142, and the first interlayer insulating film 141. Further, since the odd light emission routing line OERL is disposed in the same layer as the first light emission control line ECNL1 and includes or is formed of the same material, the odd light emission routing line OERL may be connected to the first light emission control line ECNL1 without a separate contact hole.

Alternatively, the odd light emission routing line OERL may also be disposed on the first interlayer insulating film 141. That is, the odd light emission routing line OERL may be disposed in the same layer as the second capacitor electrode CAE2, and may include or be formed of the same material. In this case, the light emission connection line ECL may be connected to the odd light emission routing line OERL through the third scan connection contact hole SCT3 penetrating the first organic film 160, the third interlayer insulating film 150, the second gate insulating film 131, and the second interlayer insulating film 142. Further, the odd light emission routing line OERL is disposed in the same layer as the first light emission control line ECNL1 and includes or is formed of the same material. Therefore, the odd light emission routing line OERL may be connected to the first light emission control line ECNL1 without a separate contact hole.

Since the even light emission routing line EERL is substantially the same as the light emission routing line ERL described with reference to FIGS. 9, 10, 12, and 15, a description thereof will be omitted.

When the residual film of the third sub-scan routing line SRL3 remains on the second interlayer insulating film 142 during the manufacturing process, the distance between the third sub-scan routing lines SRL3 adjacent to each other may be decreased. Therefore, the third sub-scan routing lines SRL3 adjacent to each other may be shorted by the residual film.

As shown in FIGS. 28 to 31, when the odd scan routing line OSRL is a single layer, and the even scan routing line ESRL includes the plurality of sub-scan routing lines SRL1 to SRL3 arranged on a plurality of layers, the distance between the third sub-scan routing lines SRL3 adjacent to each other may be increased. Therefore, it is possible to effectively prevent the third sub-scan routing lines SRL3 adjacent to each other from being shorted by the residual film.

Moreover, the cross section of the display panel taken along line II-II' in FIG. 28 is substantially the same as that in FIG. 13, and the cross section of the display panel taken along line III-III' in FIG. 28 is substantially the same as that in FIG. 14. Therefore, illustration and description thereof are omitted.

Figure 32:
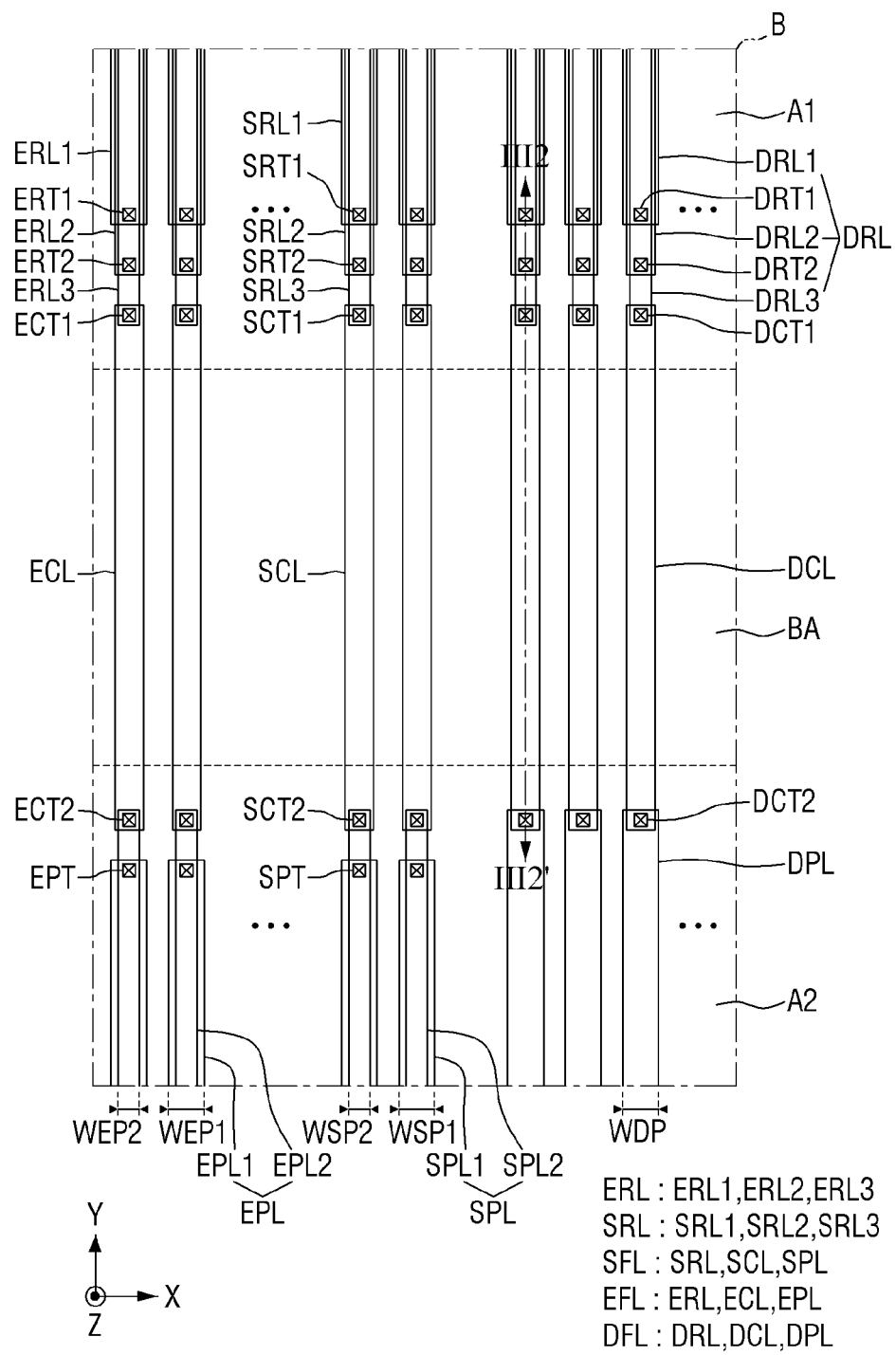
FIG. 32 is a layout view specifically illustrating still another embodiment of the area B in FIG. 5.
Figure 33:
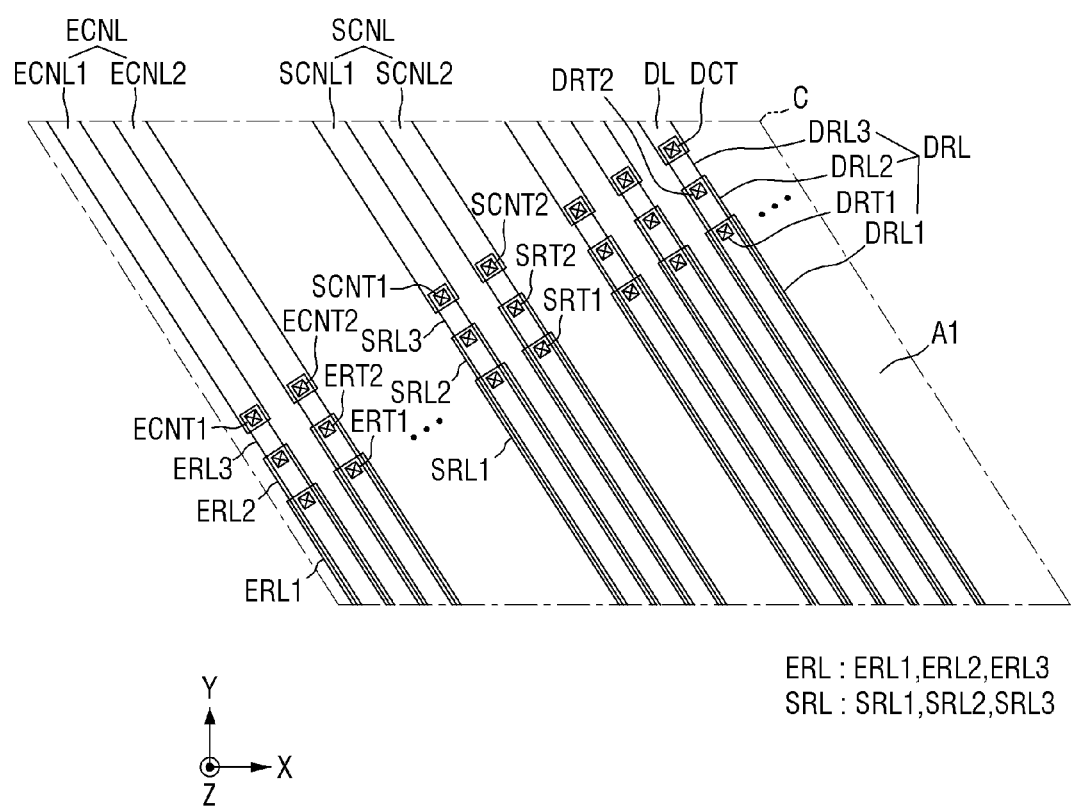
FIG. 33 is a layout view specifically illustrating still another embodiment of the area C in FIG. 5.
Figure 34:
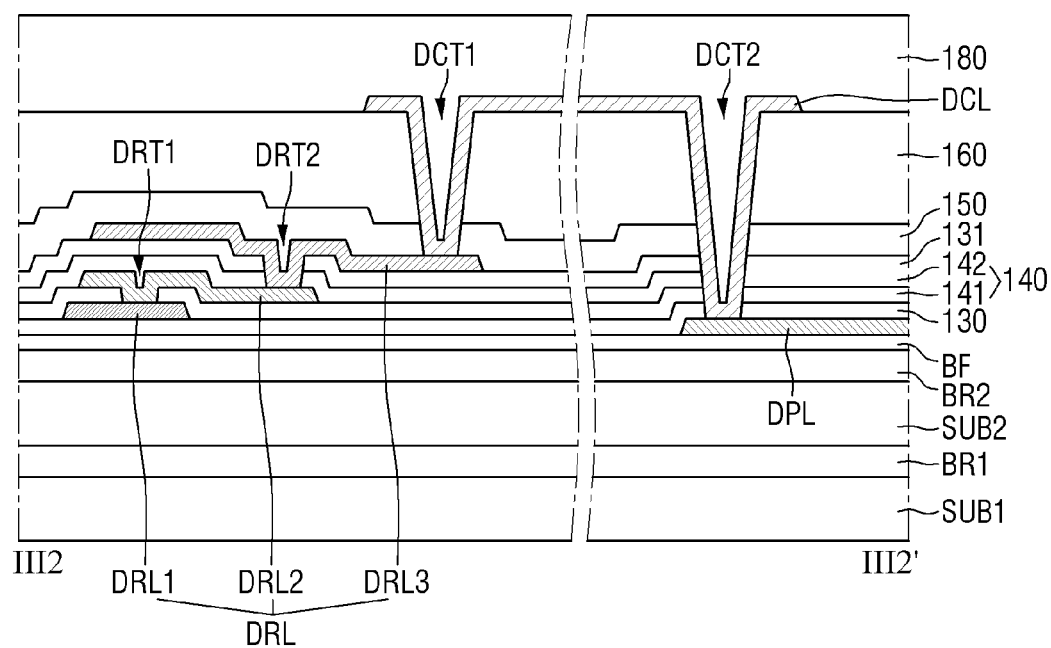
FIG. 34 is a cross-sectional view illustrating an embodiment of a display panel taken along line III2-III2' of FIG. 32.

FIG. 32 is a layout view specifically illustrating still another embodiment of the area B in FIG. 5, FIG. 33 is a layout view specifically illustrating still another embodiment of the area C in FIG. 5, and FIG. 34 is a cross-sectional view illustrating an embodiment of a display panel taken along line III2-III2' of FIG. 32.

The embodiment of FIGS. 32 to 34 is different from the embodiment of FIGS. 9, 10, and 14 in that the data routing line DRL includes a plurality of sub-data routing lines DRL1 to DRL3 arranged on a plurality of layers. In FIGS. 32 to 34, differences from the embodiment of FIGS. 9, 10, and 14 will be mainly described.

Referring to FIGS. 32 to 34, each of the data routing lines DRL may include a first sub-data routing line DRL1, a second sub-data routing line DRL2, and a third sub-data routing line DRL3. The first sub-data routing line DRL1 may be disposed on the first gate insulating film 130, the second sub-data routing line DRL2 may be disposed on the first interlayer insulating film 141, and the third sub-data routing line DRL3 may be disposed on the second gate insulating film 131.

The second sub-data routing line DRL2 may be connected to the first sub-data routing line DRL1 through the first data routing contact hole DRT1 penetrating the first interlayer insulating film 141. The third sub-data routing line DRL3 may be connected to the second sub-data routing line DRL2 through the second data routing contact hole DRT2 penetrating the second gate insulating film 131 and the second interlayer insulating film 142. The data connection line DCL may be connected to the third sub-data routing line DRL3 through the first data connection contact hole DCT1.

Besides, since the first sub-data routing line DRL1, the second sub-data routing line DRL2, and the third sub-data routing line DRL3 are substantially the same as the first sub-scan routing line SRL1, the second sub-scan routing line SRL2, and the third sub-scan routing line SRL3 described with reference to FIGS. 9, 10, and 12, respectively, descriptions thereof are omitted.

As shown in FIGS. 32 to 34, in the non-display area NDA and the first area A1, the data routing line DRL of the data fan-out line DFL may include a plurality of sub-data routing lines DRL1 to DRL3 overlapping in the third direction (Z-axis direction). Thus, even when the line widths of the plurality of sub-data routing lines DRL1 to DRL3 of the data routing line DRL in the plane defined by the first and second directions are reduced, it is possible to effectively prevent the line resistance of the data routing line DRL from being reduced. Accordingly, the width NDAW of the non-display area NDA adjacent to the first side SS1 of the display panel 100 in the second direction (Y-axis direction) may be reduced by reducing the line width of each of the data routing lines DRL as well as the scan routing lines SRL and the light emission routing lines ERL.

In exemplary embodiments of the display device, in the non-display area adjacent to the corner portion, the routing line may include sub-routing lines. Thus, even when the widths of the plurality of sub-routing lines in the plan view are reduced, a decrease in line resistance of the routing line can be effectively prevented. Therefore, the width of the non-display area of the display panel in the plan view can be reduced by reducing the line width of each routing line.

The invention should not be construed as being limited to the exemplary embodiments set forth herein. Rather, these exemplary embodiments are provided so that this invention will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention.

What is claimed is:

1. A display device, comprising:
   a substrate;
   a display area including pixels arranged on the substrate;
   a first area disposed at one side of the display area;
   a second area including pads arranged on the substrate;
   a bending area disposed between the first area and the second area; and
   a fan-out line disposed in the first area, the bending area, and the second area,
   wherein the fan-out line includes:
   a plurality of sub-routing lines arranged in the first area and electrically connected to each other; and
   a plurality of sub-pad lines arranged in the second area and electrically connected to each other,
   wherein the number of the plurality of sub-routing lines is greater than the number of the plurality of sub-pad lines.

2. The display device of claim 1,
   wherein the plurality of sub-routing lines overlaps each other in a thickness direction of the substrate.

3. The display device of claim 1,
   wherein the plurality of sub-pad lines overlaps each other in a thickness direction of the substrate.

4. The display device of claim 1,
   wherein the fan-out line further includes a connection line disposed in the bending area.

5. The display device of claim 4,
   wherein the plurality of sub-routing lines includes:
   a first sub-routing line disposed on the substrate;
   a second sub-routing line disposed on the first sub-routing line; and
   a third sub-routing line disposed on the second sub-routing line.

6. The display device of claim 5,
   wherein a width of the first sub-routing line is wider than a width of the second sub-routing line, and the width of the second sub-routing line is wider than a width of the third sub-routing line.

7. The display device of claim 5,
   wherein the width of the second sub-routing line is wider than the width of the first sub-routing line and wider than the width of the third sub-routing line.

8. The display device of claim 5,
   wherein the plurality of sub-pad lines includes:
   a first sub-pad line disposed on the substrate; and
   a second sub-pad line disposed on the first sub-pad line.

9. The display device of claim 8,
   wherein each of the pixels includes:
   a first transistor disposed on the substrate and including a first active layer containing a silicon semiconductor and a first gate electrode on the first active layer; and
   a second transistor disposed on the substrate and including a second active layer containing an oxide semiconductor and a second gate electrode on the second active layer.

10. The display device of claim 9, further comprising:
    a first insulating film disposed on the first active layer,
    wherein the first gate electrode, the first sub-routing line, and the first sub-pad line are arranged on the first insulating film, and are made of a same material.

11. The display device of claim 10, further comprising:
    a second insulating film disposed on the first gate electrode; and
    a third insulating film disposed on the second insulating film,
    wherein the second sub-routing line and the second sub-pad line are arranged on the second insulating film and are made of a same material, and
    the second active layer is disposed on the third insulating film.

12. The display device of claim 11, further comprising:
    a fourth insulating film disposed on the second active layer,
    wherein the second gate electrode and the third sub-routing line are arranged on the fourth insulating film.

13. The display device of claim 12, further comprising:
    a fifth insulating film disposed on the second gate electrode and the third sub-routing line, wherein the connection line is disposed on the fifth insulating film.

14. The display device of claim 13,
wherein the second sub-routing line is connected to the first sub-routing line through a first fan-out contact hole penetrating the second insulating film, and
the third sub-routing line is connected to the second sub-routing line through a second fan-out contact hole penetrating the third insulating film.

15. The display device of claim 13,
wherein the second sub-pad line is connected to the first sub-pad line through a pad contact hole penetrating the second insulating film, and
wherein the connection line is connected to the third sub-routing line through a first connection contact hole penetrating the fifth insulating film.

16. The display device of claim 1, further comprising:
a scan driver connected to the fan-out line, and which generates scan signals according to a timing signal of the fan-out line and outputs the scan signals to scan lines of the display area.

17. A display device, comprising:
a substrate including a first side extending in a first direction, a second side extending in a second direction, and a first corner portion where the first side and the second side meet each other;
a display area including pixels, scan lines, and data lines, which are arranged on the substrate;
a non-display area disposed adjacent to the display area;
a scan driver disposed adjacent to the first side in the non-display area and which outputs scan signals to the scan lines; and
a fan-out line disposed adjacent to the first corner portion in the non-display area and connected to the scan driver,
wherein the fan-out line includes a plurality of sub-routing lines,
the plurality of sub-routing lines overlaps each other in a thickness direction of the substrate, and
widths of the plurality of sub-routing lines are different from each other.

18. The display device of claim 17,
wherein the plurality of sub-routing lines includes:
a first sub-routing line disposed on the substrate;
a second sub-routing line disposed on the first sub-routing line; and
a third sub-routing line disposed on the second sub-routing line.

19. The display device of claim 18,
wherein the width of the first sub-routing line is wider than the width of the second sub-routing line, and the width of the second sub-routing line is wider than the width of the third sub-routing line.

20. The display device of claim 18,
wherein the width of the second sub-routing line is wider than the width of the first sub-routing line and wider than the width of the third sub-routing line.

* * * * *